(12) United States Patent
Wegmann et al.

(10) Patent No.: US 10,502,545 B2
(45) Date of Patent: Dec. 10, 2019

(54) MEASURING METHOD AND MEASURING ARRANGEMENT FOR AN IMAGING OPTICAL SYSTEM

(71) Applicant: Carl Zeiss SMT GmbH, Oberkochen (DE)

(72) Inventors: Ulrich Wegmann, Koenigsbronn (DE); Hans-Michael Stiepan, Aalen (DE); Jochen Hetzler, Aalen (DE)

(73) Assignee: CARL ZEISS SMT GMBH, Oberkochen (DE)

( * ) Notice: Subject to any disclaimer, the term of this patent is extended or adjusted under 35 U.S.C. 154(b) by 0 days.

(21) Appl. No.: 15/818,080

(22) Filed: Nov. 20, 2017

(65) Prior Publication Data

US 2018/0087891 A1    Mar. 29, 2018

Related U.S. Application Data

(63) Continuation of application No. PCT/EP2016/000832, filed on May 19, 2016.

(30) Foreign Application Priority Data

May 20, 2015 (DE) .......... 10 2015 209 173
Oct. 22, 2015 (DE) .......... 10 2015 220 588
Mar. 4, 2016 (DE) .......... 10 2016 203 562

(51) Int. Cl.
*G01B 9/02* (2006.01)
*G03F 7/20* (2006.01)
(Continued)

(52) U.S. Cl.
CPC .......... *G01B 9/02034* (2013.01); *G01B 11/24* (2013.01); *G01M 11/0264* (2013.01); *G03F 7/706* (2013.01); *G03F 7/7085* (2013.01)

(58) Field of Classification Search
None
See application file for complete search history.

(56) References Cited

U.S. PATENT DOCUMENTS 6,271,915 B1 * 8/2001 Frey .................. A61B 3/107
356/124
7,336,371 B1 * 2/2008 Haidner ............ G01M 11/0271
356/515
(Continued)

FOREIGN PATENT DOCUMENTS

DE    19818341 A1    10/1999
DE    10113017 A1    9/2002
(Continued)

OTHER PUBLICATIONS

Office Action in corresponding German Application 102016203562.2, dated Apr. 3, 2016, along with English Translation.
(Continued)

*Primary Examiner* — Shawn Decenzo
(74) *Attorney, Agent, or Firm* — Edell, Shapiro & Finnan, LLC

(57) ABSTRACT

A measurement arrangement and a method for measuring a wavefront aberration of an imaging optical system (10) of a microlithographic projection exposure apparatus. The method includes separate measurement of respective wavefront aberrations of different partial arrangements (M1; M2; M3; M1, M3) of the optical elements.

18 Claims, 9 Drawing Sheets

(51) Int. Cl.
*G01B 11/24* (2006.01)
*G01M 11/02* (2006.01)

(56) References Cited

U.S. PATENT DOCUMENTS

| | | | |
|---|---|---|---|
| 7,417,745 | B2 | 8/2008 | Haidner et al. |
| 7,605,926 | B1 | 10/2009 | Hetzler et al. |
| 2002/0001088 | A1 | 1/2002 | Wegmann et al. |
| 2003/0137654 | A1* | 7/2003 | Mizuno ............... G01M 11/0264 356/121 |
| 2004/0174533 | A1* | 9/2004 | Nakauchi ........... G01M 11/0264 356/515 |
| 2005/0105044 | A1 | 5/2005 | Warden |
| 2006/0291363 | A1* | 12/2006 | Noguchi ............ G02B 27/4238 369/112.08 |
| 2009/0147228 | A1 | 6/2009 | Ono et al. |
| 2011/0001945 | A1 | 1/2011 | Shiraishi |
| 2011/0205514 | A1* | 8/2011 | Kita .................... G03F 7/70591 355/67 |
| 2012/0127481 | A1* | 5/2012 | Schillke ............. G01B 11/2441 356/512 |
| 2012/0224186 | A1 | 9/2012 | Hetzler et al. |
| 2013/0148105 | A1* | 6/2013 | Goeppert ............ G03F 7/70591 356/51 |
| 2014/0347721 | A1 | 11/2014 | Bittner et al. |
| 2015/0198438 | A1* | 7/2015 | Hetzler .............. G01B 9/02028 359/15 |
| 2017/0336714 | A1* | 11/2017 | Arnz .................. G03F 7/70258 |
| 2017/0343449 | A1 | 11/2017 | Stiepan et al. |

FOREIGN PATENT DOCUMENTS

| | | |
|---|---|---|
| DE | 10316123 A1 | 10/2004 |
| DE | 102006014510 A1 | 10/2006 |
| DE | 102010038748 A1 | 3/2011 |
| DE | 102010038697 B4 | 2/2012 |
| DE | 102012202057 A1 | 8/2013 |
| DE | 102012217800 A1 | 4/2014 |
| DE | 102015202695 A1 | 8/2016 |
| DE | 102015220588 A1 | 4/2017 |
| EP | 0631129 A1 | 12/1994 |
| EP | 1220037 A2 | 7/2002 |
| JP | 2004128307 A | 4/2004 |
| WO | 2005114101 A1 | 12/2005 |
| WO | 2006125609 A1 | 11/2006 |
| WO | 2008110239 A1 | 9/2008 |
| WO | 2017108349 A1 | 6/2017 |

OTHER PUBLICATIONS

International Search Report in counterpart International Application No. PCT/EP2016/000832, dated Oct. 11, 2016, 3 pages.
Beyerlein et al, "Dual-wave-front computer-generated holograms for quasi-absolute testing of aspherics", Applied Optics, vol. 41, No. 13, 2002, pp. 2440-2447.
M. Beier et al, "Development, fabrication, and testing of an anamorphic imaging snap-together freedom telescope", Applied Optics, vol. 54, No. 12, 2015, pp. 3530-3542.
Office Action in corresponding German Application 102015220588.6, dated Apr. 7, 2017, along with English Translation.
International Preliminary Report on Patentability and Written Opinion in counterpart International Application No. PCT/EP2016/000832, dated Nov. 21, 2017, 8 pages.

* cited by examiner

MEASURING METHOD AND MEASURING ARRANGEMENT FOR AN IMAGING OPTICAL SYSTEM

CROSS REFERENCE TO RELATED APPLICATIONS

This is a Continuation of International Application PCT/EP2016/000832 which has an international filing date of May 19, 2016, and the disclosure of which is incorporated in its entirety into the present Continuation by reference. The following disclosure is also based on and claims the benefit of and priority under 35 U.S.C. § 119(a) to: German Patent Application No. DE 10 2015 209 173.2, filed May 20, 2015, German Patent Application No. 10 2015 220 588.6, filed Oct. 22, 2015, and German Patent Application No. 10 2016 203 562.2, filed Mar. 4, 2016, which are also incorporated in their entireties into the present Continuation by reference.

FIELD OF THE INVENTION

The invention relates to a measurement arrangement for measuring an optical unit of a microlithographic projection exposure apparatus. Further, the invention relates to a measurement apparatus and a method for measuring the shape of optical surfaces by interferometry. Moreover, the invention relates to a method for measuring a wavefront aberration of an imaging optical system of a projection exposure apparatus. The imaging optical system comprises a plurality of optical elements for imaging a pattern from an object plane into an image plane.

BACKGROUND

In microlithography, a projection exposure apparatus serves to expose a photosensitive material on a wafer with an image of structures of a mask or reticle. To this end, the projection exposure apparatus usually contains an illumination system and a projection lens. The illumination system produces a desired radiation distribution for illuminating the structures of the mask while the projection lens images the illuminated structures on the photosensitive material of the wafer with a very high resolution.

In order to meet the requirements of the imaging properties, it is necessary to produce and position the optical elements used in the projection exposure apparatus with extremely high precision. To this end, the measurement both of a complete imaging optical system and of individual optical elements currently can be performed during a production or a readjustment of projection exposure apparatuses.

Phase shifting interferometry techniques in particular, such as e.g. shear or shearing interferometry or point diffraction interferometry are used for measuring an imaging optical system of the projection exposure apparatus. DE 103 16 123 A1 describes such an apparatus for measuring the wavefront of a microlithographic projection lens by way of shearing interferometry.

Diffractive optical arrangements as so-called zero optics often are used as an interferometric measurement apparatus for precisely measuring the shape of a surface of an optical element. Here, the wavefront of a test wave is matched to an intended shape of the surface by way of a diffractive element, for example a computer-generated hologram (CGH). Deviations from the intended shape can be determined by superposing a reference wave on the test wave that is reflected at the optical element. By way of example, such a measurement apparatus is described in DE 10 2012 217 800 A1.

The ever increasing demands on imaging optical systems in microlithography lead to an ever greater complexity of these systems. By way of example, use is made of an increasing number of mirrors in microlithographic projection lenses with extreme ultraviolet radiation (EUV). However, as already mentioned above, the above-described measurement apparatuses and methods only can measure an imaging optical system as a whole or each optical element individually. When measuring a complex imaging optical system as a whole, it is difficult to assign the measured aberrations to individual optical elements. For the purposes of measuring the optical element on its own, it may be necessary to take apart the complete imaging optical system, which is connected to an ever greater time outlay on account of the increasing complexity.

SUMMARY

It is an object of the invention to provide an apparatus and a method with which the aforementioned problems can be addressed, and, in particular, with which the cause of a wavefront aberration of the imaging optical system can be determined with high accuracy and, at the same time, little time outlay.

According to a first aspect of the invention, the object is achieved by the measurement arrangement below for measuring an optical unit of a microlithographic projection exposure apparatus. The measurement apparatus contains a wavefront measurement apparatus that is configured to measure a wavefront aberration of imaging optics with measurement radiation. Furthermore, the measurement arrangement contains at least one adaptation module which is configured for such a manipulation of the wavefront of the measurement radiation that the combination of the optical unit to be measured and the at least one adaptation module forms an imaging optical arrangement. In particular, the optical unit can be one of the partial arrangements described below within the scope of a measurement method according to the invention and hence it can be a partial arrangement of an imaging optical system of a projection exposure apparatus, such as e.g. an optical module of a projection lens of the projection exposure apparatus. According to one embodiment variant, the projection exposure apparatus can be an EUV projection exposure apparatus.

Further, the object according to the first aspect of the invention can be achieved by a method for measuring an optical unit of a microlithographic projection exposure apparatus, said method comprising: arranging at least one adaptation module at the optical unit to be measured in such a way that the combination of the optical unit to be measured and the at least one adaptation module forms an imaging optical arrangement, and measuring a wavefront aberration of the imaging optical arrangement formed by the combination.

According to an embodiment, the optical unit to be measured is configured as non-imaging optics, which, if a plane or spherical input wave with a wavelength λ is radiated thereon, generate an output wave, the wavefront of which deviates by at least λ, in particular at least 10λ, from an ideal spherical wave at at least one point. In this description, such an optical unit also is referred to as "non-stigmatic" optics. Within the scope of this description, an optical arrangement which, if a plane or spherical input wave with a wavelength λ is radiated thereon, generates an output wave, the wavefront of which does not deviate by more than λ at any point, in particular does not deviate by more than 10λ at any point, from an ideal spherical wave, is also referred to as imaging optical arrangement.

According to an embodiment of the measurement arrangement, the latter is configured to measure the optical unit in the form of non-imaging optics, which, if a plane or spherical input wave with a wavelength λ is radiated thereon, generate an output wave, the wavefront of which deviates by at least λ from an ideal spherical wave at at least one point. According to an embodiment, the optical unit is assigned to an imaging optical system, comprising a plurality of optical elements, of a microlithographic projection exposure apparatus and the optical unit is formed by one of the optical elements of the imaging optical system or by a partial arrangement of the optical elements of the imaging optical system. A partial arrangement of the optical elements is understood to mean an arrangement of optical elements, i.e. of at least two optical elements, where at least one optical element is missing in relation to the imaging optical system. According to an embodiment, an imaging optical system of the projection exposure apparatus has a plurality of optical modules respectively comprising at least two optical elements and the optical arrangement comprises at least one of the optical modules and less than the plurality of optical modules.

According to a further embodiment, the optical unit is formed by a partial arrangement of the optical elements of the imaging optical system, wherein the partial arrangement of the optical elements differs from at least one section of the imaging optical system by the presence of a gap that relates to at least one optical element.

According to a further embodiment, the adaptation module is configured to shorten a back focal length of the optical unit to be measured. According to an embodiment variant, the optical unit to be measured here already forms an instance of imaging optics with, however, an unwieldily large back focal length or focal length. Here, this can relate to the lens-side and/or image-side back focal length. In particular, the optical unit is an imaging optical system, in particular a projection lens of a microlithographic projection exposure apparatus, but with a large back focal length. According to the specified embodiment, the arrangement of optical unit and adaptation module forms an imaging optical arrangement with a shortened back focal length in relation to the optical unit.

According to a further embodiment, the measurement arrangement furthermore comprises a calibration unit having the optical function of the optical unit to be measured, said calibration unit being configured to calibrate the at least one adaptation module before measuring the optical unit, the calibration being carried out by determining a wavefront aberration of an arrangement comprising the at least one adaptation module and the calibration unit. The calibration unit can comprise one or more calibration modules. Thus, in a case in which the optical unit to be measured has a gap, the calibration unit can comprise a first calibration module having the function of the section of the optical unit arranged upstream of the gap and a second calibration module having the function of the section of the optical unit arranged downstream of the gap. According to an embodiment variant, the calibration unit comprises one or more diffractive structure patterns for manipulating the measurement radiation.

The wavefront measurement apparatus and the adaptation module of the measurement arrangement can be embodied in accordance with the embodiment variants of the wavefront measurement apparatus and of an adaptation module, respectively, described below with reference to the method for measuring a wavefront aberration according to the first aspect of the invention.

By providing the aforementioned adaptation module, the measurement arrangement according to the invention and the measurement method according to the invention facilitate a separate measurement of individual optical modules of an imaging optical system, even in cases in which the optical modules are not imaging optics. This facilitates the determination of the cause of the wavefront aberration of the imaging optical system with a high accuracy and with less time outlay in comparison with an individual measurement of optical elements possibly contained in the optical module. Furthermore, the separate measurement of individual optical modules facilitates the determination of the cause of a wavefront aberration temporally before the measurement of the entire imaging optical system.

According to an embodiment of the measurement arrangement or of the measurement method, described below, according to the invention, the adaptation module is arranged upstream of the optical unit to be measured in the beam path of the wavefront measurement apparatus. In an alternative embodiment, the adaptation module is arranged downstream of the optical unit to be measured in the beam path of the wavefront measurement apparatus.

According to a further embodiment, the at least one adaptation module comprises an input-side adaptation module for manipulating the measurement radiation, arranged in a beam path of the measurement radiation upstream of the optical unit to be measured, and an output-side adaptation module for manipulating the measurement radiation, arranged in the beam path of the measurement radiation downstream of the optical unit to be measured. Both adaptation modules contain at least one optical element. By way of example, the optical elements of the adaptation modules are embodied and arranged in such a way that, together with the optical unit to be measured, they form an imaging optical arrangement. According to an embodiment of the measurement arrangement, the adaptation modules are configured in such a way that, in terms of the optical effect, the optical arrangement corresponds to an imaging optical system to be measured, wherein the optical unit is one of the plurality of optical modules of the optical system to be measured. In an alternative embodiment, the optical arrangement also may have different imaging properties, in particular a different focal length or a different imaging scale.

According to a further embodiment, the at least one adaptation module has one or more diffractive structure patterns that are used in reflection or in transmission. By way of example, the at least one adaptation module contains one or more CGHs with diffractive structure patterns. According to an embodiment, at least one CGH is provided in the beam path of the wavefront measurement apparatus upstream or downstream of the module to be measured, or it is respectively provided in both adaptation modules. In particular, it is also possible to operate two or more successively arranged diffractive structure patterns such as e.g. CGHs with respectively one diffractive structure in reflection.

In an embodiment, the at least one adaptation module contains at least two diffractive structure patterns that are superposed on one another, or arranged in succession, in a beam path of the measurement radiation. In particular, the diffractive structure patterns arranged in succession are respectively provided on a dedicated substrate, as is described, for example, in US 2012/0127481 A1. According to an embodiment, use is made of two or more CGHs that are arranged in succession in the beam path. According to a further embodiment, the two superposed structure patterns are arranged on a single substrate in the same plane, as is disclosed in e.g. DE 10 2012 217 800 A1. By way of example, provision can be made of at least one complex encoded CGH with two or more diffractive structure patterns, arranged superposed on one another, in the adaptation module.

Furthermore, according to the first aspect of the invention, the object is achieved by the method, described below, for measuring a wavefront aberration of an imaging optical system of a microlithographic projection exposure apparatus. The optical system contains a plurality of optical elements for imaging a pattern from an object plane into an image plane. The method comprises a separate measurement of respective wavefront aberrations of different partial arrangements of the optical elements.

A partial arrangement of the optical elements should be understood to mean an arrangement of some of the optical elements and, hence, comprises at least two optical elements in each case. The different partial arrangements respectively comprise a different combination of the optical elements, wherein at least one optical element is missing in relation to the imaging optical system in each combination.

By way of the separate measurement of the different partial arrangements, in particular of individual optical modules, according to the invention, it is possible to narrow down the cause for a wavefront aberration of the imaging optical system to one of the partial arrangements. Then, in the next step, there may be e.g. a measurement of the individual optical elements of this partial arrangement. Further, a single optical element possibly may be already identified as aberration source from the measurement results of the partial arrangements by way of the skillful configuration of the measured partial arrangements. In any case, an individual measurement of all optical elements of the imaging optical system is not required. Hence, the time outlay required for determining the cause of a wavefront aberration of the imaging optical system is kept low without losing accuracy. Further, a separate measurement of the individual partial arrangements also allows to deduce adjustment errors of the optical elements of an optical module that has been isolated as the cause of the aberration, said adjustment errors not being determinable with the individual measurement and possibly only being determinable with great difficulties through wavefront measurement of the imaging optical system as a whole.

According to a possible embodiment, one of the partial arrangements of the optical elements differs from at least one section of the imaging optical system by the presence of a gap that relates to at least one optical element. A gap in the arrangement is characterized in that, in the beam path of the imaging optical system, at least one optical element is placed upstream of the gap and at least one optical element is arranged downstream of the gap.

According to a further embodiment, the imaging optical system is provided with a plurality of optical modules that respectively comprise at least two of the optical elements and the separate measurement of the respective wavefront aberrations of different partial arrangements is effectuated by a separate measurement of respective wavefront aberrations of the individual optical modules. Expressed differently, the different partial arrangements are formed by the optical modules. Expressed differently, the imaging optical system is divided into a plurality of modules. Each of the modules comprises at least two optical elements that are preferably arranged in succession in the beam path of the optical system. In particular, each optical module can be removed from the optical system as a whole and can be reinserted into the latter. According to an embodiment, adjusting one or more modules in the optical system is rendered possible.

According to an embodiment, the imaging optical system is a projection lens of a microlithographic projection exposure apparatus. The imaging optical system may also be a different imaging optical assembly from the exposure beam path of the projection exposure apparatus, such as an imaging optical assembly of an illumination system of the projection exposure apparatus. According to a further embodiment, the imaging optical system can be at least one part either of a projection lens or of an illumination system of a projection exposure apparatus, i.e. either a part of the projection lens or of the illumination system or the entire projection lens or the entire illumination system. According to a further embodiment, at least one of the partial arrangements is not an instance of an imaging optics but an instance of non-stigmatic optics, as defined above, or e.g. an instance of optics with defocusing or beam-widening effect. According to a further embodiment, the partial arrangements in the form of optical modules of the imaging optical system are contained in a common housing during the operation of the projection exposure apparatus.

According to an embodiment, the method according to the invention furthermore comprises a collation of the measurement results for the individual partial arrangements to form a result for the wavefront aberration of the entire imaging optical system. Hence, the wavefront aberration of the entire imaging optical system is also measured by a separate measurement of the partial arrangements and a subsequent collation of the measurement results to form an overall result. For the purposes of measuring the entire imaging optical system after post-processing or an adaptation to certain requirements, it is only necessary to measure the respectively processed partial arrangement anew. Post-processing or an adaptation becomes performable in a substantially faster and less complicated manner by way of a modular construction of the imaging optical system.

According to an embodiment, the imaging optical system is a projection lens of a microlithographic projection exposure apparatus, in particular of an EUV projection exposure apparatus.

According to a further embodiment of the method according to the invention, measuring one of the partial arrangements comprises arranging of the partial arrangement to be measured and of at least one adaptation module in the beam path of measurement radiation of the wavefront measurement apparatus in such a way that the combination of the partial arrangement to be measured and the at least one adaptation module forms an imaging optical arrangement. Furthermore, the measuring comprises determining the wavefront aberration of the imaging optical arrangement with the wavefront measurement apparatus. The wavefront aberration of the optical module to be measured then can be determined by removing by calculation a wavefront aberration of the adaptation module known a priori from the determined wavefront aberration of the imaging optical arrangement.

The imaging optical arrangement formed by the combination of the partial arrangement to be measured and the adaptation module can be configured in such a way in an embodiment that it corresponds in terms of its optical power to the imaging optical system to be measured. Alternatively, the optical arrangement also may have different imaging properties, in particular a different focal length or a different imaging scale.

The adaptation module contains at least one optical element. The optical element or elements of the adaptation module are embodied and arranged in such a way that, together with the partial arrangement to be measured, these form the aforementioned imaging optical arrangement. By way of the imaging property of the optical arrangement it is possible, for the purposes of measuring the partial arrangement, to use, in particular, wavefront measurement apparatuses for imaging optical systems.

According to an embodiment, an apparatus for phase-shifting interferometry, in particular an apparatus for shearing interferometry or point diffraction interferometry, is used as a wavefront measurement apparatus. To this end, the optical arrangement made of the at least one adaptation module and the partial arrangement to be measured images, in one embodiment, an aperture of a pinhole that is positioned in the object plane of the optical arrangement or a coherence mask of the wavefront measurement apparatus onto a shearing grating arranged in the image plane of the optical arrangement.

According to an embodiment, an adaptation module is arranged in the beam path of the wavefront measurement apparatus upstream of the partial arrangement to be measured. Such an arrangement is particularly suitable for measuring an imaging optical system in the beam path as a last module provided upstream of the image plane or any other field plane. In a further embodiment, the adaptation module is arranged downstream of the partial arrangement to be measured in the beam path of the wavefront measurement apparatus. This arrangement is advantageous for measuring a partial arrangement that is provided first after the object plane or any other field plane in the beam path of the imaging optical system.

According to a further embodiment of the method, arranging the at least one adaptation module comprises arranging an input-side adaptation module for manipulating the measurement radiation upstream of the partial arrangement to be measured, and arranging an output-side adaptation module for manipulating the measurement radiation downstream of the partial arrangement to be measured. Both adaptation modules have at least one optical element. The optical element or elements of the adaptation modules are embodied and arranged in such a way that, together with the module to be measured, the two adaptation modules form an imaging optical arrangement. According to an embodiment of the method according to the invention, there are, arranged in the measurement radiation, adaptation modules configured in such a way that the optical arrangement, in terms of its optical effect, corresponds to the imaging optical system to be measured. Alternatively, the optical arrangement also may have different imaging properties, in particular a different focal length or a different imaging scale. Arranging two adaptation modules is particularly suitable for measuring an optical module which is provided between two other modules, or not immediately upstream or downstream of a field plane of the optical system, in the beam path of the imaging optical system.

In an embodiment of the method according to the invention, at least one diffractive structure pattern for manipulating the wavefront of the measurement radiation is used in the at least one adaptation module. In particular, the diffractive structure pattern is operated in transmission. By way of example, a diffractive structure pattern of a computer-generated hologram (CGH) can be used as a diffractive structure pattern. A computer-generated hologram is produced by calculating a suitable line structure as a diffractive structure using a computer and suitable methods, such as e.g. ray tracing, and subsequently writing the calculated line structure onto or into the surface of the substrate. The diffractive structure pattern can be arranged e.g. upstream or downstream of the partial arrangement to be measured in the beam path of the wavefront measurement apparatus. Furthermore, a diffractive structure pattern also may be arranged in every one of the two above-described adaptation modules.

According to a further embodiment of the method, the diffractive structure pattern for manipulating the wavefront of the measurement radiation is operated in reflection. By way of example, a diffractive structure part of a CGH is used as a diffractive structure pattern. In particular, it is also possible to operate two or more successively arranged diffractive structure patterns such as e.g. CGHs with respectively one diffractive structure in reflection. The CGH or CGHs are arranged e.g. upstream or downstream of the partial arrangement to be measured in the beam path of the wavefront measurement apparatus. Furthermore, CGHs that are operated in reflection are used in both adaptation modules in an embodiment. CGHs that are operated in reflection facilitate, in particular, a measurement of the partial arrangement using EUV radiation.

According to an embodiment of the method according to the invention, for the purposes of manipulating the measurement radiation, use is made in the at least one adaptation module of at least two diffractive structure patterns that are arranged successively in the beam path of the measurement radiation. Expressed differently, the diffractive structure patterns are arranged in such a way that the measurement radiation successively interacts with the two diffractive structure patterns. In particular, the first diffractive structure pattern and the second diffractive structure pattern respectively are arranged on a dedicated substrate. By way of example, such a diffractive arrangement is disclosed in the patent application US 2012/0127481 A1. By way of example, use is made of two CGHs that are arranged successively in the beam path. Such an arrangement of diffractive structures, which is also referred to as a "double CGH", facilitates the simultaneous change in the location and the direction of a measurement beam. In this way, it is possible to adapt the imaging properties of the optical arrangement with the partial arrangement to be measured and the at least one adaptation module particularly well to the imaging properties of the optical system to be measured.

In accordance with an embodiment according to the invention, for the purposes of manipulating the measurement radiation, use is made in the at least one adaptation module of at least two diffractive structure patterns that are arranged superposed on one another in the beam path. In particular, the two diffractive structure patterns are arranged superposed on one another on a single substrate in the same plane. Such superposing diffractive structure patterns for producing separate output waves with different propagation directions are described in, for example, DE 10 2012 217 800 A1. According to an embodiment, a complex encoded CGH with two or more diffractive structure patterns that are arranged superposed on one another is used in an adaptation module. Consequently, there is a different deflection of the various measurement beams at a location of the diffractive structures. As a result of these measures, it is possible, in particular, to image simultaneously more than one field point, e.g. a pinhole array, in the object plane of the optical arrangement onto a shearing grating in the image plane of the optical arrangement.

Furthermore, according to the first aspect of the invention, provision is made of the method, described below, for measuring a wavefront aberration of an imaging optical system of a microlithographic projection exposure apparatus. The optical system contains a plurality of optical elements for imaging a pattern from an object plane into an image plane. The method comprises a provision of the imaging optical system with a plurality of optical modules that each comprise at least two of the optical elements. Furthermore, the method comprises a separate measurement of the respective wavefront aberrations of the individual optical modules.

Expressed differently, a plurality of modules are provided in the imaging optical system. Each of the modules comprises at least two optical elements that are preferably arranged in succession in the beam path of the optical system. In particular, each module can be removed from the optical system as a whole and can be reinserted into the latter. According to an embodiment, adjusting one or more modules in the optical system is provided.

According to a second aspect of the invention, the object is achieved by the measurement apparatus, described below, for measuring optical surfaces of a microlithographic projection exposure apparatus by interferometry. The measurement apparatus contains an integral wave-forming element which has diffractive structures for producing measurement radiation with a wavefront that is adapted to at least two non-contiguous optical surfaces arranged next to one another. Here, the measurement apparatus is configured to measure a relative positioning of the optical surfaces in relation to one another in respect of at least one rigid body degree of freedom. Furthermore, the measurement apparatus comprises an interferometer for measuring the measurement radiation by interferometry, after interaction with the optical surfaces.

As a result of the option of measuring the relative positioning of the optical surfaces in relation to one another in respect of at least one rigid body degree of freedom, a respective form of the optical surfaces can be determined from the interferometric measurement result with taking account of the determined relative positioning. This facilitates the simultaneous measurement of the shape of both optical surfaces. Hence, there is a reduction in the time outlay required for measuring some or all of the optical elements of an imaging optical system of the type described above with reference to the first aspect of the invention, e.g. a microlithographic projection lens. Hence, the time for determining the cause of a wavefront aberration of the imaging optical system is reduced.

According to an embodiment, the measurement apparatus according to the second aspect of the invention comprises an evaluation device for determining a respective shape of the optical surfaces from the interferometric measurement result with taking account of the determined relative positioning.

Further, the object according to a second aspect of the invention is achieved by the method, set forth below, for measuring the shape of optical surfaces of a microlithographic projection exposure apparatus by interferometry. The method comprises the following steps: arranging at least two non-contiguous optical surfaces in a beam path of measurement radiation with a wavefront that is adapted to the optical surfaces, said measurement radiation being produced by an integral wave-forming element having diffractive structures; determining a relative positioning of the optical surfaces in relation to one another in respect of at least one rigid body degree of freedom; and simultaneously measuring the respective shape of the optical surfaces by interferometry with the measurement radiation, taking into account the determined relative positioning.

Expressed differently, the wave-forming element in the measurement apparatus according to the invention and in the method produces, through its diffractive structures, measurement radiation which is directed to each of the optical surfaces. Additionally, the wavefront of the measurement radiation reaching a surface is respectively adapted to the shape of said surface. In particular, to this end, the diffractive structures can transform a test radiation, which is provided by e.g. an interferometer, in such a way that respectively one measurement wave with an appropriately adapted wavefront is produced for each optical surface. The adaptation of the wavefront is preferably embodied in such a way that the wavefront corresponds to the respective intended shape of the surface at the location of each optical surface. In this way, null optics are realized for each surface, in the case of which a surface with the intended shape would reflect the measurement radiation back into itself.

By way of example, a CGH with diffractive structures arranged next to one another on a substrate is used as a wave-forming element for each of the optical surfaces. Alternatively, provision may also be made of a complex encoded CGH with diffractive structures, which are superposed on one another in a plane, for two more surfaces.

The measurement radiation is reflected back from the optical surfaces, it once again passes through the integral wave-forming element and it is subsequently measured in the interferometer by superposition with a reference wave. Here, a characteristic interferogram arises for each surface in the case of a deviation from the respective intended shape. By way of example, a Fizeau interferometer, a Michelson interferometer or a Twyman-Green interferometer can be used as an interferometer. All that is essential is capturing an interferogram during the superposition of the reflected measurement radiation with a reference wave. By way of example, an interferogram can be captured by a CCD camera.

Additionally, the relative positioning of the optical surfaces in relation to one another is determined. Here, at least one relative spatial or tilt coordinate is determined as a relative rigid body degree of freedom. To this end, use can be made of, for example, interferometric methods. Finally, an evaluation device can determine the shape of every optical surface and its relative positioning in relation to the other surfaces through the captured interferograms and by taking account of the at least one measured rigid body degree of freedom. Here, values of further rigid body degrees of freedom can be ascertained with the aid of the captured values and interferograms. Alternatively, provision may also be made for a storage of the captured interferograms and values of relative rigid body degrees of freedom for a later evaluation or a transmission to an external evaluation unit.

According to an embodiment, the optical surfaces are part of a projection lens of a microlithographic projection exposure apparatus, in particular of an EUV projection exposure apparatus. By way of example, the optical surfaces are reflecting surfaces of mirrors of an EUV projection lens. The surfaces can be embodied to be e.g. plane, spherical or aspherical, with or without rotational symmetry.

An embodiment of the measurement apparatus according to the invention is configured to measure the relative positioning of the optical surfaces in relation to one another in a direction that is transverse to the optical surfaces. In particular, the relative positioning is measured in the direction of a mean propagation direction of the measurement radiation. According to an embodiment variant, the measurement apparatus is configured to additionally measure the relative positioning of the optical surfaces in relation to one another in one or both directions of extent of the optical surfaces.

According to a further embodiment of the measurement apparatus according to the invention, the wave-forming element has diffractive auxiliary measurement structures for producing auxiliary waves which are respectively focused onto one of the optical surfaces.

In particular, the auxiliary measurement structures transform some of the measurement radiation into auxiliary waves. Here, one or more diffractive auxiliary measurement structures can be provided for each optical surface. According to an embodiment, the auxiliary measurement structures are embodied as additional diffractive structures on a CGH as a wave-forming element.

According to a further embodiment, the measurement apparatus has a plurality of wave-forming elements or one wave-forming element with a plurality of diffractive structures for respectively measuring a portion of at least one of the optical surfaces. In particular, the evaluation device is embodied here to compile partial measurements to form an overall measurement of the optical surfaces. In particular, the measurement apparatus can be embodied for using different wave-forming elements, for example wave-forming elements embodied as CGHs, for successively measuring different portions of one or more optical surfaces. Alternatively, or additionally, provision can also be made of a sealing device, e.g. with one or more shutters, which only lets measurement radiation pass for selectable portions. Compiling the partial measurements to form an overall measurement of the surfaces can be effectuated by, for example, so-called stitching, which is described in e.g. WO 2005/114101 A1. By way of this measure, it is also possible to measure surfaces in the case of which the reflecting measurement radiation of two or more surfaces crosses at least in part. In such a case, which a person skilled in the art also knows as a "caustic network", the corresponding section of the interference pattern can no longer be uniquely assigned to an optical surface. By way of such a measurement of portions being effectuated in succession, it is possible to avoid such running together of the reflected measurement radiation. Further, very large optical surfaces also can be measured in their entireties through this embodiment.

In an embodiment of the method according to the invention for measuring the shape of optical surfaces by interferometry, the relative positioning of the optical surfaces in relation to one another is measured with auxiliary waves which are produced from the measurement radiation by auxiliary measurement structures of the wave-forming element. In particular, the auxiliary measurement structures transform some of the measurement radiation into auxiliary waves. According to one embodiment variant, one or more auxiliary waves are produced for each optical surface. The auxiliary measurement structures can be provided as additional diffractive structure patterns in a CGH as a wavefront element.

According to an embodiment of the method for measuring the shape, portions of at least one of the optical surfaces are measured successively in each case using different wave-forming elements or different diffractive structures of a wave-forming element. Subsequently, the partial measurements are compiled to form an overall measurement of the optical surfaces. In accordance with the corresponding embodiment of the measurement apparatus, it is possible, for example, to successively use different CGHs for different portions, a sealing apparatus for blocking the measurement radiation for certain portions, or both. Compiling the partial measurements preferably is effectuated by the aforementioned stitching method.

Further, according to an embodiment of the method for measuring optical surfaces by interferometry, the non-contiguous optical surfaces are arranged on a common substrate. In particular, the optical surfaces are positioned next to one another on a side of the substrate. Here, the optical surfaces may be embodied, for example, for reflecting illumination radiation of the projection exposure apparatus and, as a consequence, may constitute a double mirror or multi-mirror. A particularly compact structure is realized by using one substrate for a plurality of surfaces.

According to an alternative embodiment, the non-contiguous optical surfaces respectively are arranged on separate substrates. As a consequence, it is also possible, for example, to simultaneously measure two or more mirrors arranged next to one another, for example two mirrors arranged next to one another with a flat angle of incidence for a projection lens in EUV microlithography. Here, the relative orientation in relation to one another is also determined in addition to the respective shape.

The features specified in relation to the embodiments, exemplary embodiments and embodiment variants, etc., listed above, of the measurement arrangement according to the invention according to the first aspect and the measurement apparatus according to the second aspect can be transferred accordingly to the respective method according to the invention according to the first aspect or the second aspect, and vice versa. Furthermore, the specified in relation to the embodiments, exemplary embodiments and embodiment variants, etc., listed above, of the method according to the invention and the measurement arrangement according to the invention according to the first aspect of the invention can be transferred to the measurement apparatus according to the invention and method according to the invention according to the second aspect of the invention, and vice versa. These and other features of the embodiments according to the invention are explained in the description of the figures and in the claims. The individual features can be implemented, either separately or in combination, as embodiments of the invention. Furthermore, they can describe advantageous embodiments which are independently protectable and protection for which is claimed if appropriate only during or after pendency of the application.

BRIEF DESCRIPTION OF THE DRAWINGS

The above and further advantageous features of the invention are illustrated in the following detailed description of exemplary embodiments according to the invention with reference to the accompanying schematic drawings. In the figures.

DETAILED DESCRIPTION

In the exemplary embodiments or embodiments or embodiment variants described below, elements which are functionally or structurally similar to one another are provided with the same or similar reference signs as far as possible. Therefore, for understanding the features of the individual elements of a specific exemplary embodiment, reference should be made to the description of other exemplary embodiments or the general description of the invention. In order to facilitate the description, a Cartesian xyz-coordinate system is indicated in some drawings, from which system the respective positional relationship of the components illustrated in the figures is evident.

Figure 1:
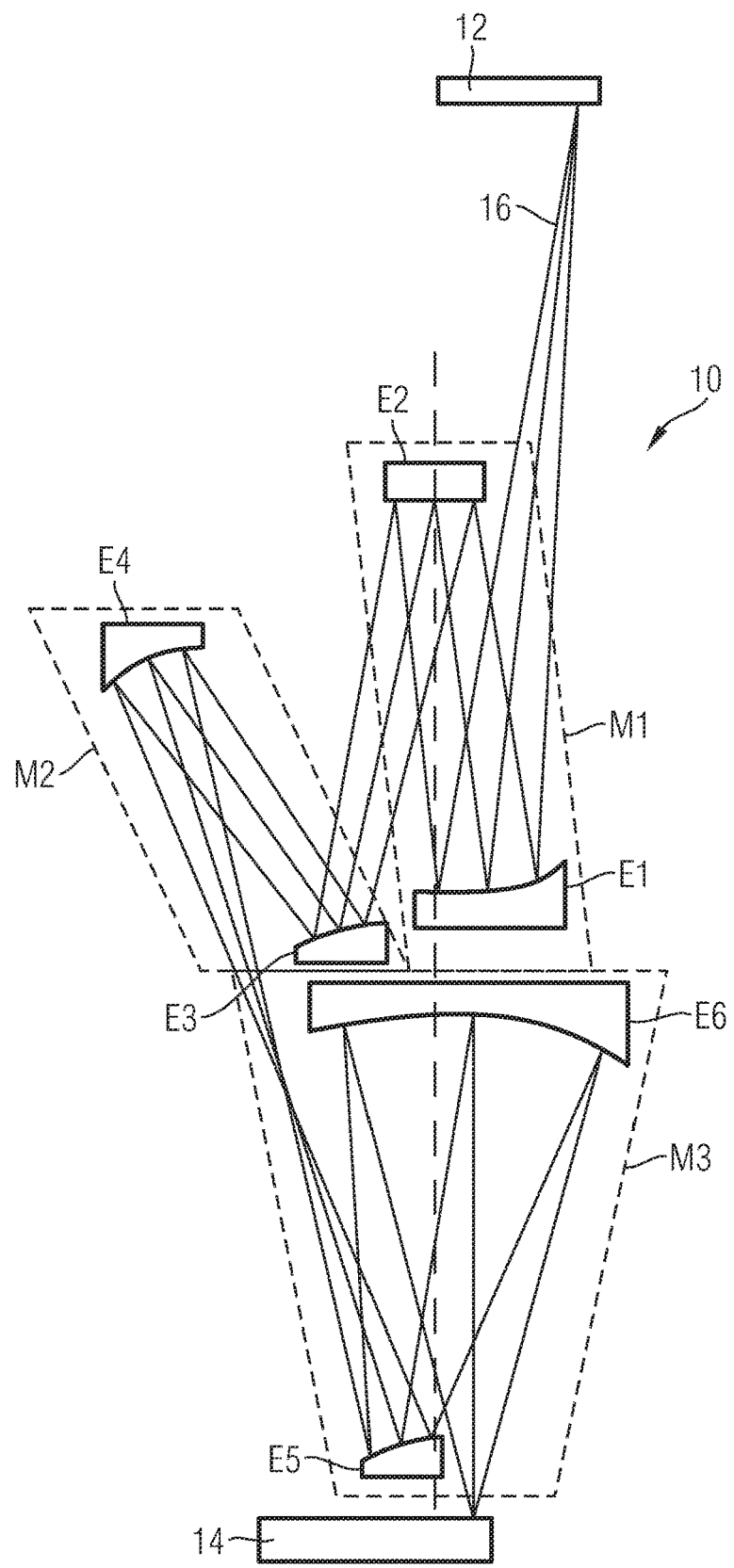
FIG. 1 shows, in a schematic illustration, an exemplary embodiment of a microlithographic projection lens having optical elements arranged in optical modules.

FIGS. 1 to 13 illustrate a first aspect of the invention. FIG. 1 shows an embodiment of a projection lens 10 of a microlithographic projection exposure apparatus in a schematic illustration. The projection lens 10 images a pattern of a mask or a reticle 12 onto a radiation-sensitive coating of a wafer 14. To this end, the pattern of the reticle 12 is arranged an object plane and the radiation-sensitive coating of the wafer 14 is arranged in an image plane of the projection lens 10. In this exemplary embodiment, the projection lens 10 is embodied for microlithography with EUV radiation (extreme ultraviolet radiation) with a wavelength of less than 100 nm, in particular with a wavelength of approximately 13.5 nm or approximately 6.8 nm, and said projection lens therefore contains only optical elements operated in reflection. The EUV radiation that is provided by an illumination system that is not illustrated here is also reflected at the reticle 12. In alternative embodiments, it is also possible to use optical elements that are used in transmission, such as lens elements or prisms, or else use a transmission reticle, particularly in the case of exposure radiation in a longer wavelength spectral range. Thus, for example, use can also be made of the embodiment of a projection lens 10, illustrated in FIG. 9, with optical elements in the form of lens elements.

The projection lens 10 according to FIG. 1 comprises six optical elements in the form of mirrors E1, E2, E3, E4, E5 and E6 which, proceeding from the reticle 12, are successively arranged in a beam path 16 of the projection lens 10. FIG. 1 illustrates the beam path 16 for a field point of the reticle 12 in an exemplary manner. The mirror E1 has a concave mirror surface and is arranged together with the substantially plane mirror E2 in a first optical module M1. Furthermore, the mirror E3 with a convex mirror surface is arranged together with the concave mirror E4 in a second optical module M2 and the convex mirror E5 is arranged together with a concave mirror E6 in a third optical module M3. As a consequence, the modules M1, M2 and M3 each contain optical elements that follow one another in the beam path 16. Each of the modules M1, M2 and M3 represents an optical unit in the form of a partial arrangement of the optical elements in the form of the mirrors E1 to E6 of the projection lens 10. Expressed differently, each of the modules M1 to M3 comprises some of the mirrors E1 to E6, to be precise respectively two of these mirrors in the present case.

Each module M1, M2, M3 can be individually removed from, and reinserted into, the projection lens 10. Using appropriate adjustment apparatuses, it is possible not only to adjust the individual mirrors E1, E2, E3, E4, E5, E6 but also adjust the individual modules M1, M2, M3, respectively as a whole. In this way, it is possible, firstly, to adapt optical properties of the projection lens 10 quickly to modified requirements by interchanging one or more modules M1, M2, M3. Secondly, for the purposes of post-processing one of the optical elements of the projection lens 10 for correcting aberrations, it is only necessary to remove and possibly take apart the corresponding module M1, M2 or M3.

The described modules M1, M2, M3 only represent examples of possible modules. In other exemplary embodiments of the projection lens 10, the modules may contain more than two optical elements, for example three or four optical elements, or else only a single optical element. Depending on the construction, the projection lens 10 furthermore may also contain fewer or more than three modules and, in particular, it may also contain optical elements comprised by no module. Further, a modular construction of other components of a microlithographic projection exposure apparatus is likewise possible, such as e.g. a modularly constructed illumination system for illuminating the mask.

Within the scope of the production of optical modules or the post-processing of individual modules or optical elements contained in a module, a very precise measurement of the optical properties of the respective module is necessary. In particular, deviations from a desired wavefront change by the module must be determined very precisely. As a rule, such a measurement of the wavefront aberrations of the module cannot be readily performed using the known apparatuses for measuring projection lenses since the individual modules generally do not constitute an imaging optical system.

Figure 2:
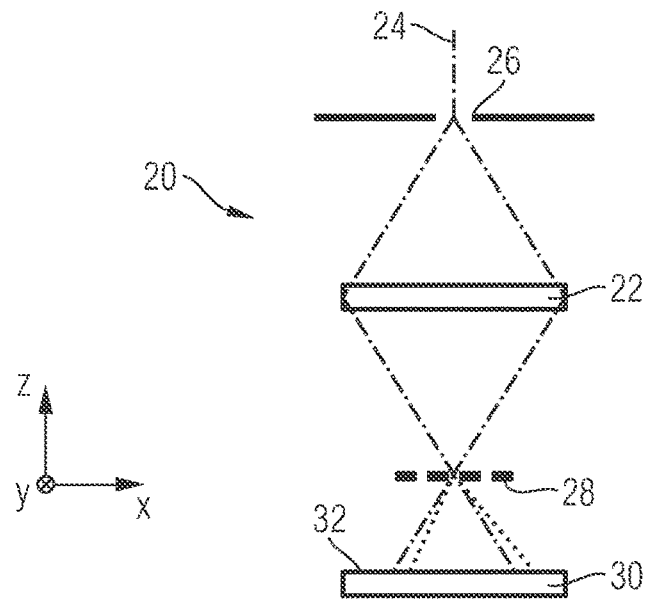
FIG. 2 shows, in a schematic illustration, a wavefront measurement apparatus for an imaging optical system.

FIG. 2 schematically illustrates a known wavefront measurement apparatus 20 for measuring imaging optics 22. The wavefront measurement apparatus 20 is embodied as a shearing interferometry that is based on a phase-shifting interferometry technique and suitable, for example, for very precisely determining aberrations of a projection lens or other imaging optics 22 from microlithography. The wavefront measurement apparatus 20 contains a radiation source not illustrated here, which provides electromagnetic measurement radiation 24. The wavelength of the measurement radiation 24 preferably corresponds to the wavelength of the radiation used during the operation of the imaging optical system 22. In particular, EUV radiation serves as measurement radiation 24. However, it is also possible to provide measurement radiation with a different wavelength in the visible or non-visible spectral range.

Furthermore, the wavefront measurement apparatus 20 contains an aperture of a pinhole 26 arranged in the object plane of the imaging optics 22 and a shearing grating 28 arranged in the image plane of the imaging system 22. Instead of the pinhole 26, it is also possible to use a pinhole grid or a coherence mask. The measurement radiation 24 passes through the aperture of the pinhole 26 and then propagates with a spherical wavefront. The imaging optics 22 image the measurement radiation 24 onto the shearing grating 28. The shearing grating 28 represents a phase-shifting diffraction grating. Arranged downstream of the shearing grating 28 is a detector 30 of the wavefront measurement apparatus 20. By way of a lateral movement of the shearing grating 28 in the x- or y-direction, interference patterns are captured at the detector 30, from which interference patterns it is possible to highly precisely ascertain the spatial derivative of the wavefront in the relevant movement direction and finally, from this, image aberration information of the imaging optics 22. By way of example, such a wavefront measurement apparatus is described in DE 103 16 123 A1.

A precondition for measuring optics with the wavefront measurement apparatus 20 is that the optics to be measured image the aperture of the pinhole 26 onto the shearing grating 28. However, as already mentioned previously, this, as a rule, is not the case for modules of an imaging optical system, such as e.g. the modules M1 to M3 of the projection lens 10 according to FIG. 1. Various exemplary embodiments of a measurement arrangement 40 for measuring an optical unit that is not suitable for imaging the aperture of the pinhole 26 onto the shearing grating 28 are described below, in each case together with a corresponding method. In particular, the measurement arrangement 40 is configured for measuring such an optical unit which does not have any imaging property but, for example, is an instance of optics with a defocusing or beam-widening effect. Therefore, the measurement arrangement 40 according to the invention is suitable for the respective measurement of the individual modules M1, M2 and M3 of the projection lens 10 according to FIG. 1.

Figure 3:
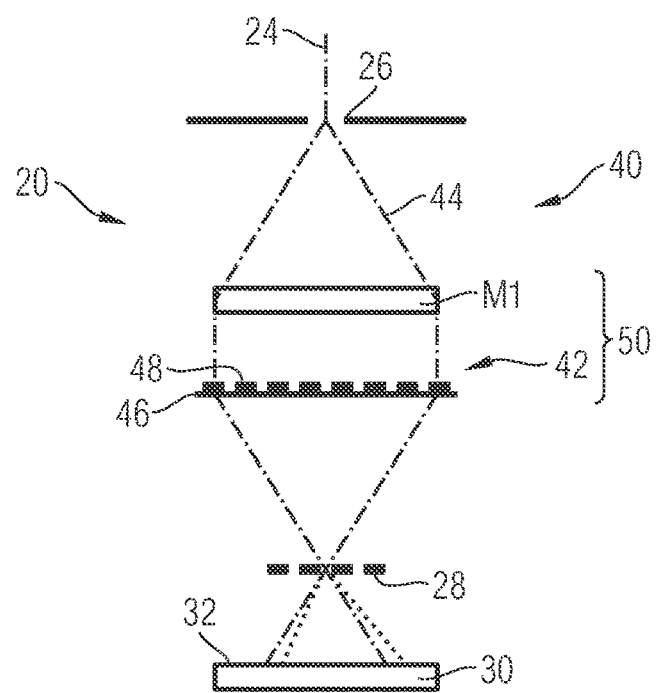
FIG. 3 shows, in a schematic illustration, an exemplary embodiment of a measurement arrangement having an adaptation module arranged downstream of an optical module in the beam path.

FIG. 3 schematically elucidates a first exemplary embodiment of a measurement arrangement 40 for measuring module M1 of the projection lens 10 according to FIG. 1. The measurement arrangement 40 comprises the wavefront measurement apparatus 20 according to FIG. 2. Alternatively, it is also possible to use any other wavefront measurement apparatus for imaging optical systems, which is based on phase-shifting interferometry, e.g. shearing or point diffraction interferometry, or any other technique. Furthermore, the measurement arrangement 40 comprises an adaptation module 42 which, together with a module M1 to be measured, is arranged in the beam path 44 of the measurement radiation 24. In this exemplary embodiment, the adaptation module 42 is arranged downstream of the module M1 in the beam path 44 and contains a transmission-operated CGH 46 with a diffractive structure pattern 48. The diffractive structure pattern 48 of the CGH 46 and hence also the adaptation module 42 are embodied and arranged in such a way that the aperture of the pinhole 26 is imaged onto the shearing grating 28 by the combination of the optical power of the module M1 to be measured and of the adaptation module 42. As an alternative or in addition to the CGH 46, the adaptation module 42 also may contain refractive or reflective optical elements, such as lens elements or mirrors, in other exemplary embodiments.

Expressed differently, the adaptation module 42 complements the module M1 to be measured to form an imaging optical arrangement 50. Using the module M1 of the projection lens 10 according to FIG. 1 as an example of a module to be measured, the adaptation module 42 represents, in terms of its optical power, a replacement or imitation of the other modules M2 and M3 of the projection lens 10. With the arrangement of the adaptation module 42 downstream of the module M1 to be measured in the beam path 44, this exemplary embodiment, as a consequence, is particularly suitable for measuring modules which are arranged immediately downstream of the object plane or any other field plane in the beam path of an imaging system. When measuring the optical arrangement 50 by the wavefront measurement apparatus 20, a wavefront aberration of the optical arrangement 50 is determined with an evaluation device that is not depicted here. From this, it is possible, in turn, to determine a wavefront aberration of the module M1 very accurately when taking into account the known optical properties of the adaptation module 42 or of the CGH 46.

Figure 4:
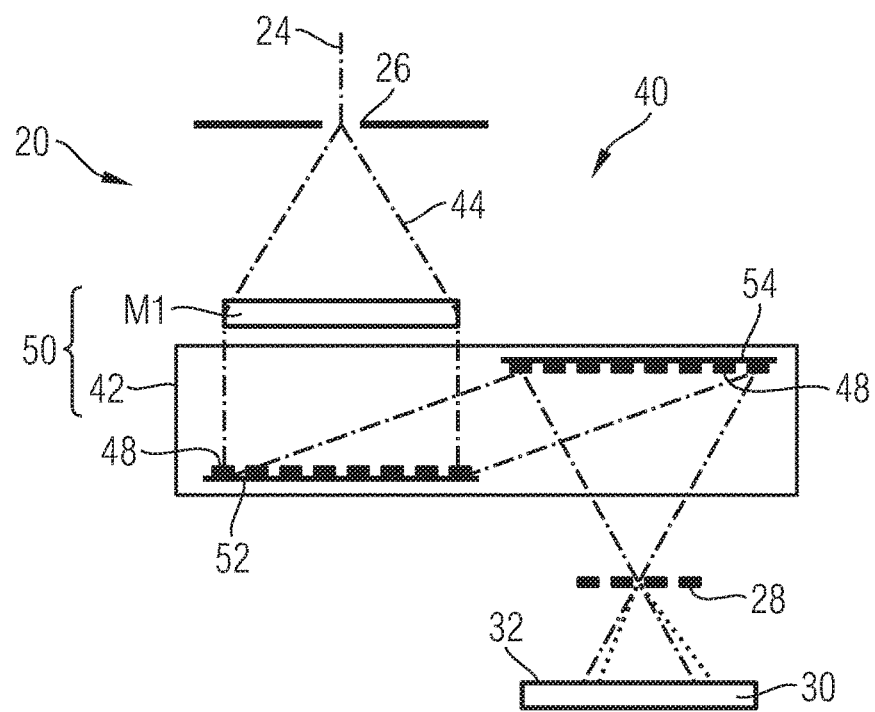
FIG. 4 shows, in a schematic illustration, a further exemplary embodiment of a measurement arrangement having an adaptation module arranged downstream of an optical module in the beam path.

FIG. 4 illustrates a further exemplary embodiment of a measurement arrangement 40 with an adaptation module 42 that is arranged downstream of a module M1 to be measured in the beam path 44. The measurement arrangement 40 substantially corresponds to the measurement arrangement according to FIG. 3. However, instead of a CGH operated in transmission, the adaptation module 42 contains two CGHs 52, 54 operated in reflection, each with a diffractive structure pattern 48. The two CGHs 52, 54 are arranged in succession in the beam path 44. Alternatively, the adaptation module 42 may contain only one CGH, or more than two CGHs, used in reflection. The diffractive structure patterns 48 of the CGHs 52, 54 are configured in such a way that, together with the module M1, they image the aperture of the pinhole 26 onto the shearing grating 28. Further, provision additionally also may be made of further diffractive, reflective or refractive optical elements in the adaptation module 42, such as CGHs operated in transmission, mirrors or lens elements. By using CGHs in reflection, the module M1 can also be measured using EUV measurement radiation 24.

Figure 5:
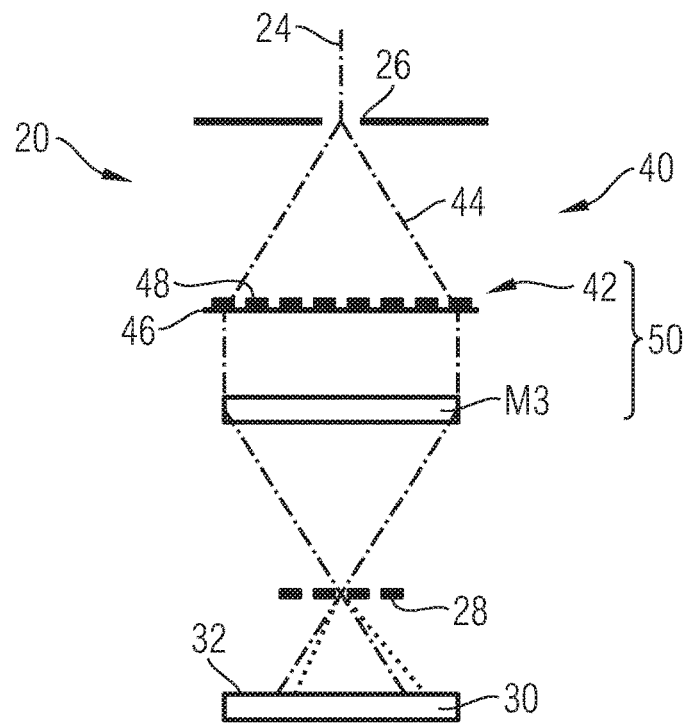
FIG. 5 shows, in a schematic illustration, an exemplary embodiment of a measurement arrangement having an adaptation module arranged upstream of an optical module in the beam path.

FIG. 5 illustrates a further exemplary embodiment of a measurement arrangement 40. The measurement arrangement 40 differs from the preceding measurement arrangements by having a different arrangement of the adaptation module 42 for measuring a module M3. The module M3 is a module that is arranged last in the beam path of an imaging optical system upstream of an image plane or any other field plane, for example the module M3 of the projection lens 10 according to FIG. 1. The adaptation module 42 is arranged upstream of the module M3 in the beam path 44 of the wavefront measurement apparatus 20. It contains a CGH 46 operated in transmission and having a diffractive structure 48. The diffractive structure 48 of the CGH 46 and hence also the adaptation module 42 are configured and arranged in such a way that, together with the module M3, they constitute an imaging optical arrangement 50. In particular, the optical arrangement 50 images the aperture of the pinhole 26 onto the shearing grating 28. As a consequence, the adaptation module 42 e.g. replaces the modules M1 and M2 with its optical power when measuring the module M3 of the projection lens 10. In other embodiments, the adaptation module 42 alternatively or additionally contains one or more refractive, reflective or reflection-operated diffractive optical elements.

Figure 6:
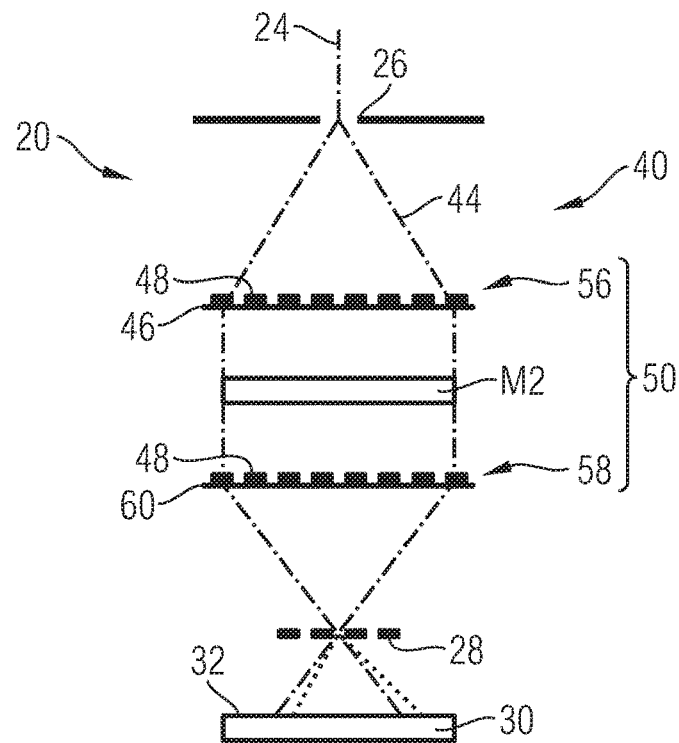
FIG. 6 shows, in a schematic illustration, an exemplary embodiment of a measurement arrangement having adaptation modules arranged upstream and downstream of an optical module in the beam path.

FIG. 6 schematically shows an exemplary embodiment of a measurement arrangement 40 having a first adaptation module 56 arranged upstream of a module M2 to be measured, e.g. the optical module M2 of the projection lens 10 according to FIG. 1, in the beam path 44 and having a second adaptation module 58 arranged downstream of the module M2 in the beam path 44. The adaptation modules 56, 58 each have a CGH 46, 60 operated in transmission and having a diffractive structure pattern 48. The diffractive structures 48 of the two CGHs 46, 60 and hence also the two adaptation modules 56, 58 are configured in such a way that, together with the module M2, they constitute an imaging arrangement 50 for the aperture of the pinhole 26. When measuring the module M2 of the projection lens 10 according to FIG. 1, the adaptation module 56 consequently replaces the module M1 in terms of its optical power and the adaptation module 58 replaces the module M3 in terms of its optical power. Therefore, the measurement arrangement 40 is particularly suitable for modules of an imaging optical system which are arranged either directly upstream or directly downstream of a field plane of the optical system. Alternatively, or additionally, refractive, reflective or reflection-operated diffractive optical elements also may be provided in one or both adaptation modules 56, 58.

Figure 7:
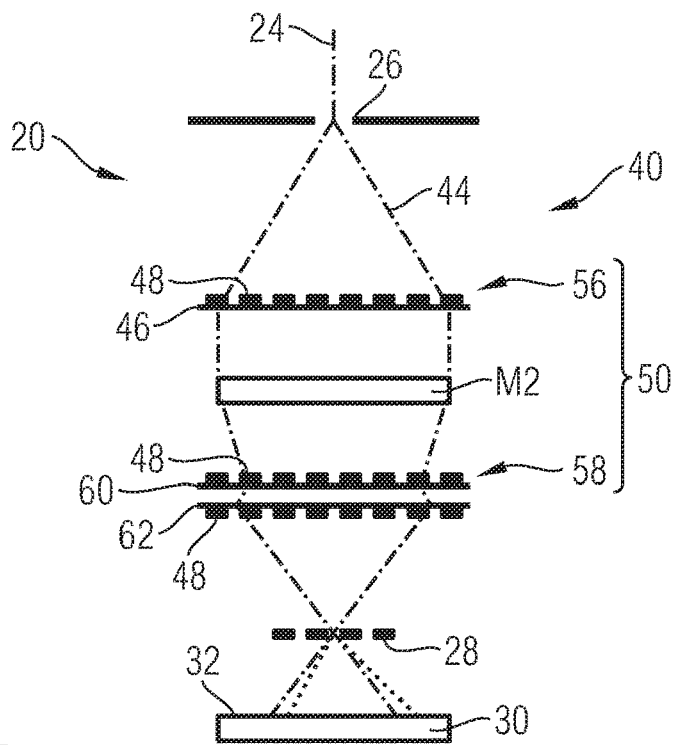
FIG. 7 shows, in a schematic illustration, an exemplary embodiment of a measurement arrangement having two diffractive structure patterns arranged successively in the beam path.

FIG. 7 shows a further exemplary embodiment of a measurement arrangement 40. In principle, the measurement arrangement 40 corresponds to the measurement arrangement according to FIG. 6 but, in the adaptation module 58, it provides two CGHs 60, 62, each with a diffractive structure 48, arranged in succession in the beam path 44 of the wavefront measurement apparatus 20. By way of example, such an arrangement, also known as a "double CGH", is described in the patent application US 2012/0127481 A1. In an alternative embodiment, one of the diffractive structures can be arranged on one side of a substrate and the other of the diffractive structures can be arranged on another side of a substrate.

A double CGH facilitates a simultaneous change in the location and in the direction of a measurement beam. In this way, an imaging property of the optical arrangement 50 having the adaptation module and the module M2 to be measured can be obtained better in some modules M2 to be measured. By way of example, an optical power that is adapted more exactly to the optical module M3 to be replaced can be obtained by the adaptation module 58 with the CGHs 60, 62 when measuring the module M2 of the projection lens 10.

In further embodiments, a double CGH is provided in the adaptation module 56 arranged upstream of the module M2 in the beam path 44 or in both adaptation modules 56, 58. Furthermore, it is also possible to use to CGHs operated in reflection as a double CGH. In addition to the double CGH, further refractive, reflective or diffractive optical elements may be arranged in one or both of the adaptation modules 56, 58.

Figure 8:
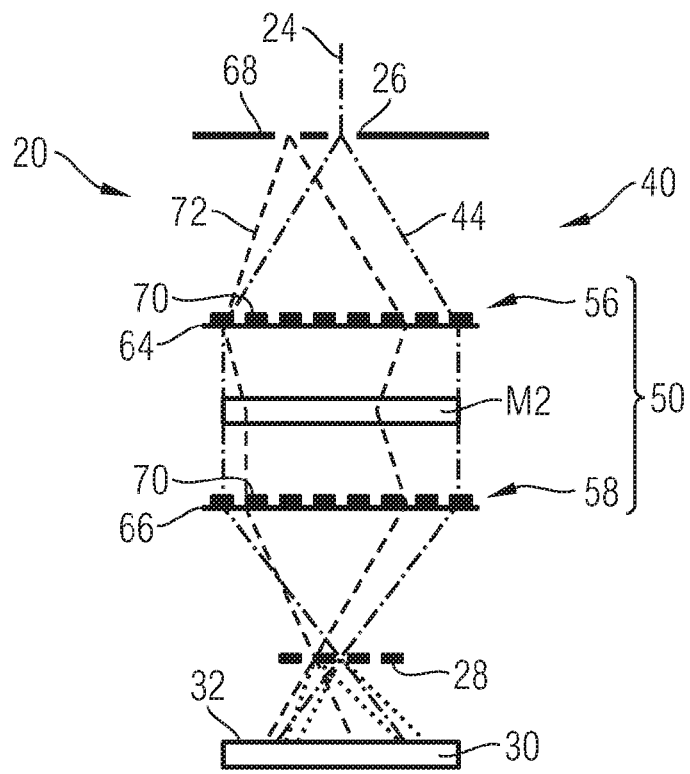
FIG. 8 shows, in a schematic illustration, an exemplary embodiment of a measurement arrangement having two diffractive structure patterns arranged superposed on one another in the beam path.

FIG. 8 furthermore illustrates an exemplary embodiment of a measurement arrangement 40 according to FIG. 6 with respectively one complex encoded CGH 64 or 66 in the adaptation modules 56 and 58 and a second pinhole 68. Each of the complex encoded CGHs 64, 66 contains two diffractive structure patterns 70 that are arranged superposed on one another in the beam path 44. In particular, the diffractive structure patterns 70 are arranged superposed on one another in a plane of the CGHs 64, 66. By way of example, such complex encoded CGHs are described in DE 10 2012 217 800 A1. The measurement radiation 44 from the aperture of the pinhole 26 is transformed by one of the diffractive structures of the CGHs 64, 66, while measurement radiation 72 is transformed by the aperture of the second pinhole 68 by way of the other diffractive structure of the CGHS 64 and 66. In this way, the adaptation modules 56 and 58, together with the module M2, constitute an optical arrangement 50 which simultaneously images the aperture of the first pinhole 26 and the aperture of the second pinhole 68 onto the shearing grating 28. Using this, it is possible to simultaneously measure two field points of the object plane of the optical arrangement 50.

In other embodiments, provision can be made of only one adaptation module 42 with a complex encoded CGH upstream of a module M3 to be measured, corresponding to the measurement apparatus according to FIG. 5, or, in a manner analogous to the measurement apparatus according to FIG. 3, provision can be made of an adaptation module with a complex encoded CGH downstream of a module M1 to be measured. Also, further refractive, reflective or diffractive optical elements can be arranged in addition to the complex encoded CGHs 64, 66 in one or both of the adaptation modules 56, 58 or in an adaptation module 42 upstream or downstream of the optical module to be measured.

Figure 9:
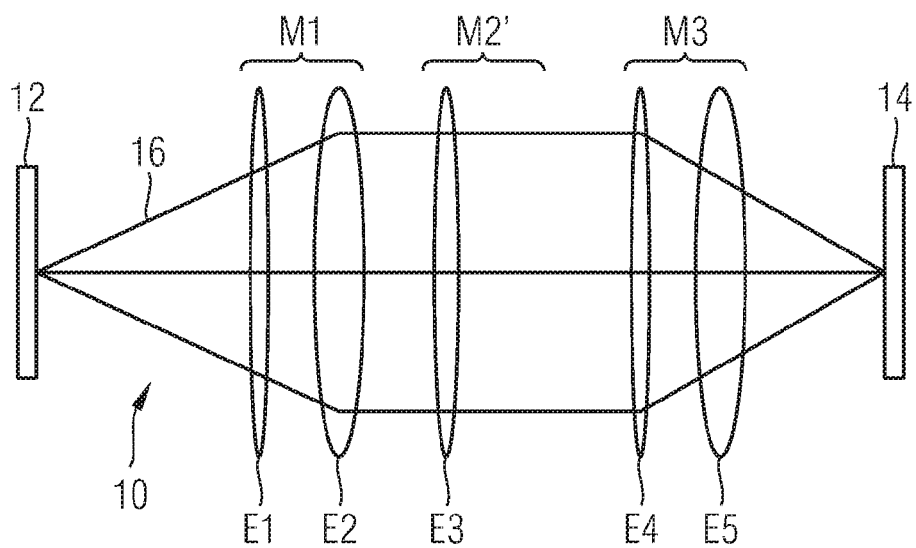
FIG. 9 shows, in a schematic illustration, a further embodiment of a microlithographic projection lens having optical elements arranged in optical modules.

FIG. 9 illustrates a further embodiment of a projection lens 10 of a microlithographic projection exposure apparatus. It differs from the embodiment according to FIG. 1 in that, herein, the projection lens 10 is designed for operation with UV radiation instead of EUV radiation and, as a consequence, the optical elements E1 to E5 are embodied as lens elements. Analogous to the embodiment according to FIG. 1, the projection lens 10 according to FIG. 9 comprises three optical modules M1, M2' and M3, wherein the module M1 contains the optical elements E1 and E2, the module M2' only contains the optical element E3 in the present case and the module M3 contains the optical elements E4 and E5. The module M2' may also contain a plurality of optical elements in further embodiment variants. Each of the modules M1, M2' and M3 constitutes an optical unit of the projection lens 10. Here, the modules M1 and M3 are respectively formed by a partial arrangement of the optical elements E1 to E5 of the projection lens 10 and the module M2' is formed by the optical element E3 only.

Figure 10:
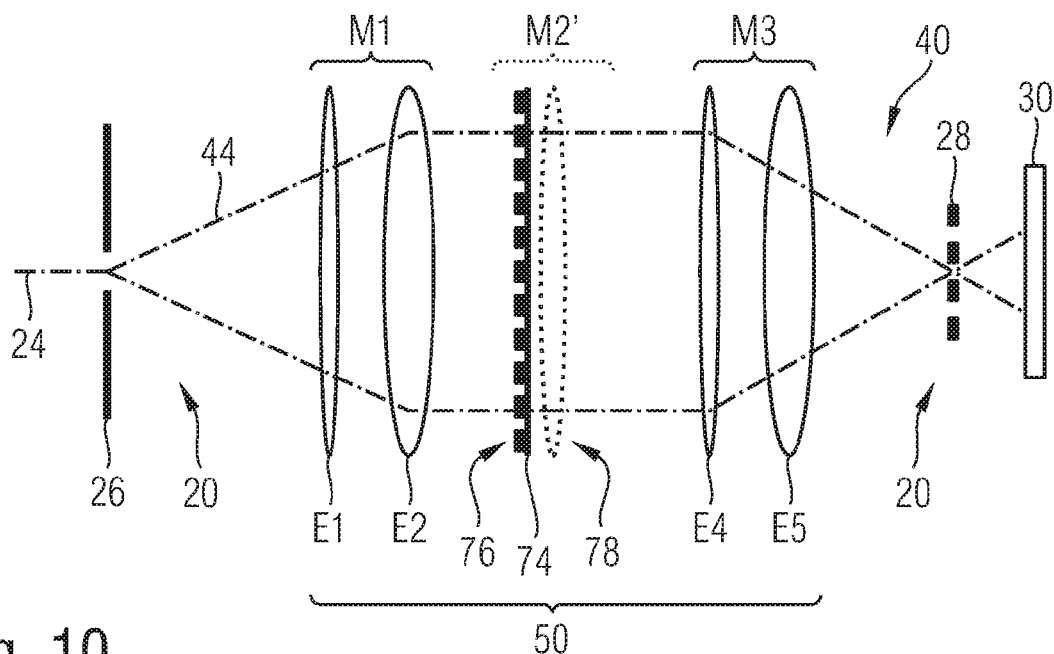
FIG. 10 shows, in a schematic illustration, a further exemplary embodiment of a measurement arrangement having an adaptation module arranged between two optical modules in the beam path.

In addition to measuring the individual modules M1, M2' and M3 in a manner analogous to the embodiments according to FIGS. 3 to 8, a measurement of a combination of modules, such as e.g. modules M1 and M3, also can be considered, as illustrated in the measurement arrangement 40 contained in FIG. 10. In this embodiment variant, the module M2' in the form of the optical element E3 is removed from the projection lens 10 according to FIG. 9 such that the remaining modules M1 and M3 constitute an optical unit formed by a partial arrangement of the optical elements E1 to E5, in which a gap 78 is present in place of the optical element E3. An adaptation module 74 that corresponds to the optical function of the module M2' in the form of the optical element E3 is arranged in the region of the gap 78. The adaptation module 74 contains a CGH operated in transmission and having a diffractive structure pattern 76. The optical arrangement 50 formed by the module M1, the adaptation module 74 and the module M3 is measured by the wavefront measurement apparatus 20 according to FIG. 2. Using this measurement, the wavefront aberration of the partial arrangement formed by the combination of the modules M1 and M3 and made of the optical elements E1, E2, E3 and E5 can be determined very accurately.

Using the described exemplary embodiments for a measurement arrangement and a method, it is possible to carry out a measurement of all optical modules of an imaging optical system, for example in the form of the projection lens 10, and/or a measurement of various combinations of optical modules in a manner analogous to FIG. 10 or, in general, a measurement of different partial arrangements of the optical elements of the imaging optical system. According to an embodiment of the invention, one of the described methods comprises determining wavefront aberrations of an entire imaging optical system on the basis of the wavefront aberrations determined for each partial arrangement, in particular the wavefront aberrations determined for each module of the optical system. Analogously, an exemplary embodiment of a measurement arrangement comprises a correspondingly embodied evaluation device for determining wavefront aberrations of the imaging optical system on the basis of the measurement results for each individual partial arrangement of the optical system.

Figure 11:
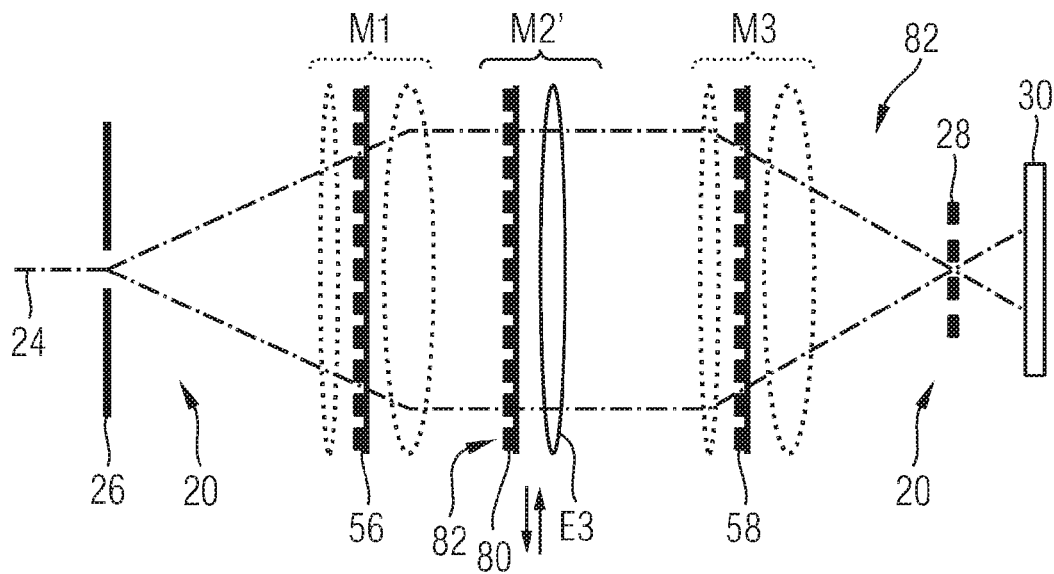
FIG. 11 shows an illustration of a calibration of two adaptation modules using a calibration module.

FIG. 11 illustrates the calibration of an arrangement of two adaptation modules. The two adaptation modules are an input-side adaptation module 56 and an output-side adaptation module 58 for measuring the measurement module M2' of the projection lens 10 according to FIG. 9. In the shown embodiment, the measurement module M2' only comprises the optical element E3. The measurement arrangement has an analogous construction to the measurement arrangement according to FIG. 6. In the measurement arrangement illustrated in FIG. 11, the input-side adaptation module 56 is configured as a CGH with the optical function of the module M1 and the output-side adaptation module 58 is configured as a CGH with the optical function of the module M3. Initially, the arrangement of the two adaptation module 56 and 58 is calibrated prior to the measurement process.

To this end, a calibration unit 80 which has the optical function of the optical unit to be measured in the form of the optical module M2' is arranged in place of the optical module M2' in the beam path 44 between the adaptation modules 56 and 58. The calibration unit 80 is configured as a CGH with a diffractive structure pattern 82. The calibration arrangement 82 made of the input-side adaptation module 56, the calibration unit 80 and the output-side adaptation module 58 is now measured by the wavefront measurement apparatus 20. Taking into account the wavefront aberrations of the calibration unit 80 known in advance, the wavefront aberration of the arrangement of the two adaptation modules 56 and 58 is determined as a calibration result from the wavefront aberration ascertained in the process. For the purposes of measuring the optical module M2', the calibration module 80 is now replaced by the module M2' and the wavefront aberration ascertained in the process is corrected on the basis of the calibration result.

Figure 12:
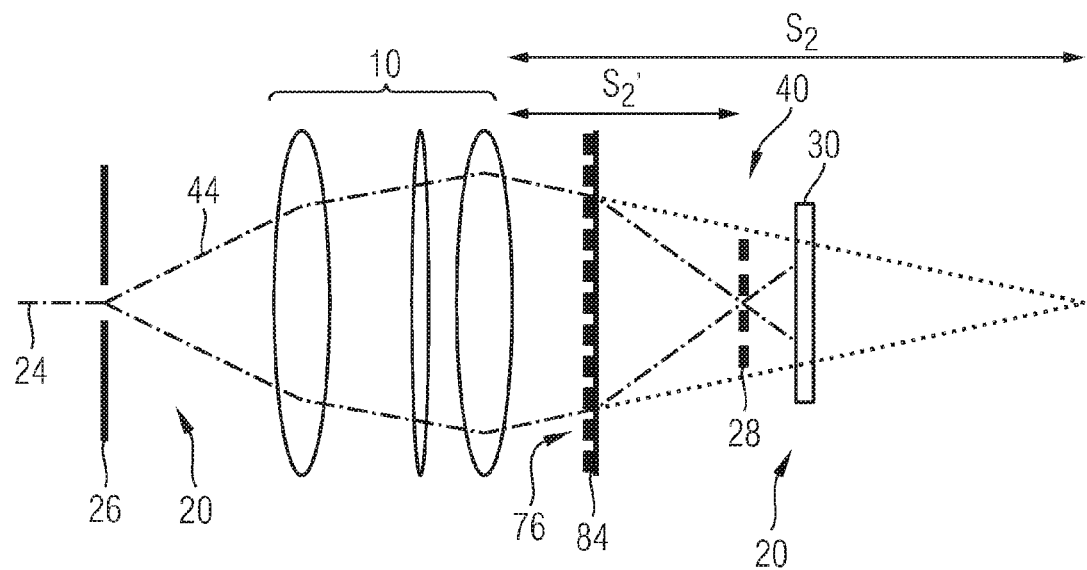
FIG. 12 shows a further exemplary embodiment of a measurement arrangement having imaging optical systems and an adaptation module for shortening an output-side back focal length of the imaging optical system.
Figure 13:
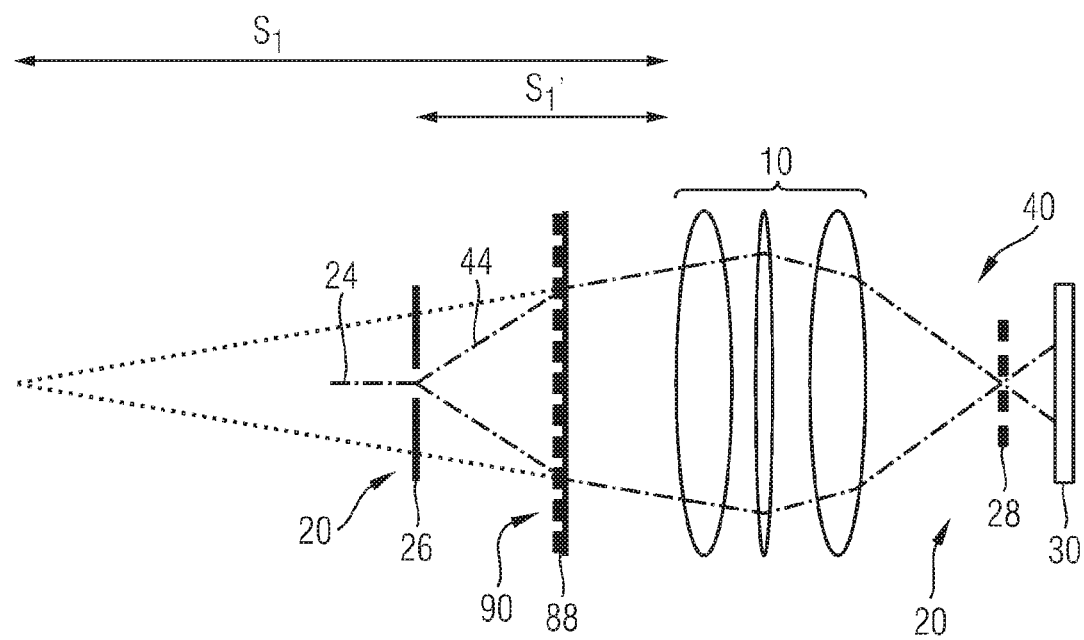
FIG. 13 shows a further exemplary embodiment of a measurement arrangement having imaging optical systems and an adaptation module for shortening an input-side back focal length of the imaging optical system.

FIGS. 12 and 13 illustrate further embodiments of a measurement arrangement 40. In these embodiments, the measurement arrangement 40 serves to measure an optical unit in the form of an imaging optical system, such as e.g. a projection lens 10 of a microlithographic projection exposure apparatus. The projection lens 10 illustrated in FIG. 12 is characterized by a very long output-side back focal length $s_2$ or a focal length of the order of several meters, such as e.g. six meters. In order to reduce the installation space required for the measurement arrangement 40, it has, in addition to the wavefront measurement apparatus 20 and arranged downstream of the projection lens 10, an adaptation module 84 in the form of a CGH with a diffractive structure pattern 86. The adaptation module 84 significantly shortens the output-side back focal length $s_2$ to a reduced back focal length $s_2'$, in particular by at least a factor of 2, 3 or 4.

Analogously thereto, the measurement arrangement 40 according to FIG. 13 is configured to measure a projection lens 10 which is characterized by a very long input-side back focal length $s_1$ or focal length of the order of several meters. For the purposes of reducing the installation space required for the measurement arrangement 40, it has, disposed upstream of the projection lens 10, an adaptation module 88 in the form of a CGH with a diffractive structure pattern 90. The adaptation module 88 significantly shortens the input-side back focal length $s_1$ to a reduced back focal length $s_1'$, in particular by at least a factor of 2, 3 or 4.

The geometric shape of the diffractive structure patterns of the used adaptation modules in the form of CGHs, such as the adaptation modules 74, 56, 58, 84 or 88 according to FIGS. 10 to 13, are adapted in accordance with an embodiment to the respective beam cross section of the measurement radiation 44 present at the used location of the adaptation module. Thus, the areas described by the diffractive structure patterns may have e.g. a circular shape, an elliptical shape or a sickle-shaped shape. In the case of adaptation modules arranged in the near field, dedicated surface regions of the aforementioned shape can be provided in each case for the individual field points. In the case of adaptation modules that are arranged near the pupil, the regions of the diffractive structure patterns that are assigned to the individual field points overlap.

FIGS. 14 to 17 below relate to exemplary embodiments of a measurement apparatus and of a method for measuring the shape of optical surfaces by interferometry in accordance with a second aspect of the invention. The exemplary embodiments of a measurement apparatus are described together with exemplary embodiments of the corresponding method in each case.

Figure 14:
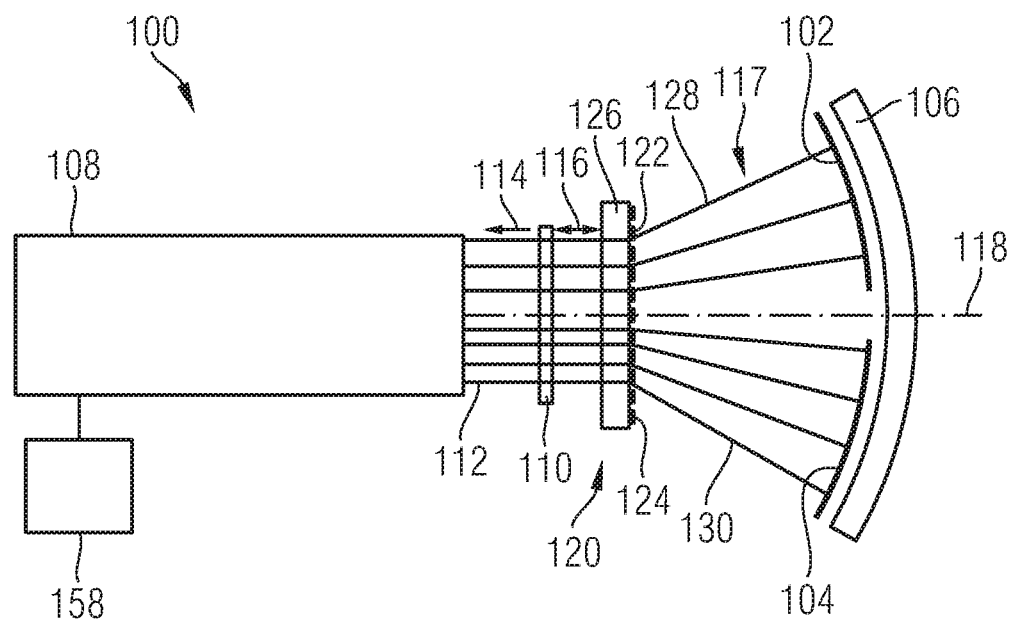
FIG. 14 shows, in a schematic illustration, an exemplary embodiment of a measurement apparatus for measuring the shape of optical surfaces by interferometry.

FIG. 14 illustrates a first exemplary embodiment of a measurement apparatus 100 for measuring the shape of optical surfaces by interferometry. In particular, the measurement apparatus 100 is suitable for simultaneous measurement of at least two optical surfaces 102 and 104 that are arranged next to one another on a common substrate 106. In addition to a deviation of the actual shape of the respective surface 102 or 104 from an intended shape, it is also possible to determine the relative spatial orientation of the surfaces 102 and 104 to one another. By way of example, the optical surfaces 102 and 104 arranged on the same substrate 106 can adopt the function of two mirror elements of a projection lens for a projection exposure apparatus for EUV microlithography.

The measurement apparatus 100 contains an interferometer 108 with a Fizeau element 110. The structure and functionality of such a Fizeau interferometer are known to a person skilled in the art. In particular, the interferometer 108 comprises a radiation source for producing electromagnetic illumination radiation 112 that is sufficiently coherent for interferometric measurement. By way of example, provision to this end can be made of a laser, e.g. a helium-neon laser with a wavelength of approximately 633 nm. The illumination radiation 12 also may have a different wavelength in the visible or non-visible wavelength range of electromagnetic radiation.

By way of example, the illumination radiation 112 is formed into a collimated beam with a substantially plane wavefront by way of a collimator. In alternative embodiments, it is also possible to generate a divergent or convergent beam with a spherical wavefront. The collimated beam is incident on the Fizeau element 110. A component of the illumination radiation is reflected back in the form of a reference wave 114 by a Fizeau surface of the Fizeau element 110. A component of the illumination radiation 112 that passes through the Fizeau element 110 continues to propagate as test radiation 116 along the optical axis 118 of the interferometer 108 and impinges on a wave-forming element 120. Measurement radiation 117 is produced from impinging test radiation 116 using the wave-forming element 120, said measurement radiation being composed of two measurement waves 128 and 130. After interaction with the optical surfaces 102 and 104 that are arranged in the beam path of the measurement waves 128 and 130 and after interaction with other optical elements provided in the beam path, the measurement radiation 117 passes through the Fizeau element 110 and into the interferometer 108 and the reference wave 114 is superposed thereon at said location. An interferogram produced in a capturing plane as a result thereof is captured by, for example, a CCD sensor of an interferometer camera. In alternative exemplary embodiments, a Michelson interferometer, a Twyman-Green interferometer or any other suitable interferometer type may be used as an interferometer.

The wave-forming element 120 contains a first diffractive structure 122 and a second diffractive structure 124 and it is embodied as a CGH 126 in this exemplary embodiment. Here, the first diffractive structure 122 and the second diffractive structure 124 are arranged next to one another in a plane in the CGH 126. In alternative embodiments, more than two diffractive structures can be arranged next to one another in a plane of the CGH or provision can be made of a complex encoded CGH having a two or more diffractive structures that are arranged in a plane superposed on one another as a wave-forming element.

The first diffractive structure 122 is configured in such a way that, from a component of the impinging test radiation 116, it produces a first measurement wave 128 that is directed to the optical surface 102 with a wavefront that is adapted to an intended shape of the first surface 102. Accordingly, the second diffractive structure 124 is embodied to produce, from another component of the test radiation 116 impinging on the wave-forming element 120, a second measurement wave 130 that is directed to the second optical surface 104 and in the form of a measurement wave with a wavefront adapted to an intended shape of the second surface 104. Here, the wavefronts are adapted in such a way that the wavefronts of the measurement waves 128 and 130 each correspond to the respective intended shape of the surfaces 102 and 104, respectively at the location of the optical surfaces 102 and 104. In this way, zero optics are respectively realized for the first optical surface 102 and the second optical surface 104, in which a surface with the intended shape would reflect the measurement wave 128 or 130 back into itself. In further embodiments of the measurement apparatus, provision can be made of additional diffractive structures on the CGH 126 or a complex encoded CGH for the purposes of simultaneously measuring more than two surfaces, which additional diffractive structures are respectively configured for an appropriate adaptation of the measurement radiation 117 for a further optical surface.

The substrate 106 with the optical surfaces 102 and 104 to be measured is arranged in the beam path of the test radiation 116 via a holding apparatus (not illustrated). The respective measurement wave 128 or 130 is reflected back from the optical surfaces 102 and 104, it once again passes through the integral wave-forming element 120 and it is subsequently measured in the interferometer 108 by superposition with the reference wave 114. Here, an interferogram arises in a capturing plane for each of the surfaces 102 and 104 in the case of a deviation from the respective intended shape, said interferogram being captured, for example, by a CCD sensor of an interferometer camera (not illustrated).

In addition to the simultaneous shape measurement of the two optical surfaces 102 and 104, there is an additional measurement of the relative positioning of the optical surfaces 102 and 104 in relation to one another by way of the measurement apparatus 100. This is described in more detail below with reference to FIG. 15. Finally, using an evaluation device 158, the respective shape of the surfaces 102 and 104 and their relative orientation in relation to one another are determined. To this end, the evaluation device 158 uses the captured interferograms and a measured relative position value of the optical surfaces 102 and 104 in relation to one another for at least one rigid body degree of freedom. Alternatively, there may also be a storage of the captured interferograms and position value for a later evaluation or a transmission to an external evaluation device.

Figure 15:
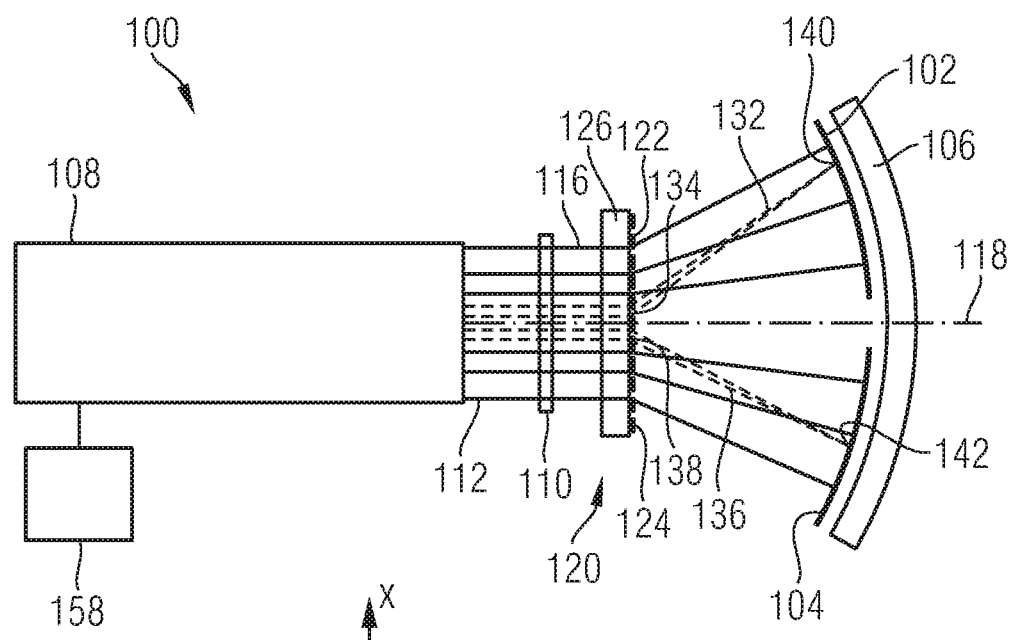
FIG. 15 shows, in a schematic illustration, the exemplary embodiment according to FIG. 14 with auxiliary waves for determining a relative position of the optical surfaces in relation to one another.

FIG. 15 shows the exemplary embodiment according to FIG. 14 with auxiliary waves 132 and 136 for determining a relative position of the optical surfaces 102 and 104 in relation to one another. For the purposes of producing a first auxiliary wave 132, a first auxiliary measurement structure 134 is arranged in the CGH 126 of the wave-forming element 120 in addition to the diffractive structures 122 and 124. The first auxiliary measurement structure 134 contains a diffractive structure pattern which is configured in such a way that it produces the first auxiliary wave 132, which is focused onto an intended point 140 of the first surface 102, from a component of the impinging test radiation 116.

Furthermore, a second auxiliary measurement structure 138 is arranged in the CGH 126 in addition to the diffractive structures 122 and 124 and the first auxiliary measurement structure 134. The second auxiliary measurement structure 138 contains a diffractive structure pattern which is embodied in such a way that it produces a second auxiliary wave 136, which is focused onto an intended point 142 of the second surface 104, from a component of the impinging test radiation 116.

After a back reflection of the auxiliary waves 132 and 136 at the respective points 140 and 142 of the optical surfaces 102 and 104, these are measured by interferometry in the interferometer 108 by superposition of the reference wave 114. A deviation of the optical surface 102 or 104 at the respective point 140 or 142 from the intended focal point is measured very accurately with the aid of the evaluation unit. By way of example, the relative z-coordinate of the optical surfaces 102 and 104 is determined in relation to the points 140, 142 together with the angles, respectively set by the auxiliary measurement structures 134 and 138, between the optical axis 118 of the interferometer 108 and the propagation directions of the auxiliary waves 132 and 136. In this case, the z-axis of the coordinate system describing the relative position of the surfaces 102, 104 in relation to one another is arranged parallel to the optical axis 118 or substantially parallel to the mean propagation direction of the measurement radiation 117 and hence transversely to the optical surfaces 102 and 104. Determining the relative x-coordinate, y-coordinate and the tilt coordinates of the two optical surfaces 102 and 104 relative to one another is then effectuated by evaluating the measured reflected measurement waves of the surface measurement or the ascertained shapes of the surfaces 102 and 104, taking into account the known relative z-coordinate.

Additional auxiliary measurement structures for auxiliary waves may be provided on the wave-forming element in other embodiments of the measurement apparatus 100 in order thus to determine a deviation of further points of the optical surfaces from an intended focus. Further, additional plane or spherical adjustment structures can be arranged next to the optical surfaces on the substrate, which adjustment structures are measured in terms of their spatial position with the aid of auxiliary waves with plane or spherical wavefronts.

Figure 16:
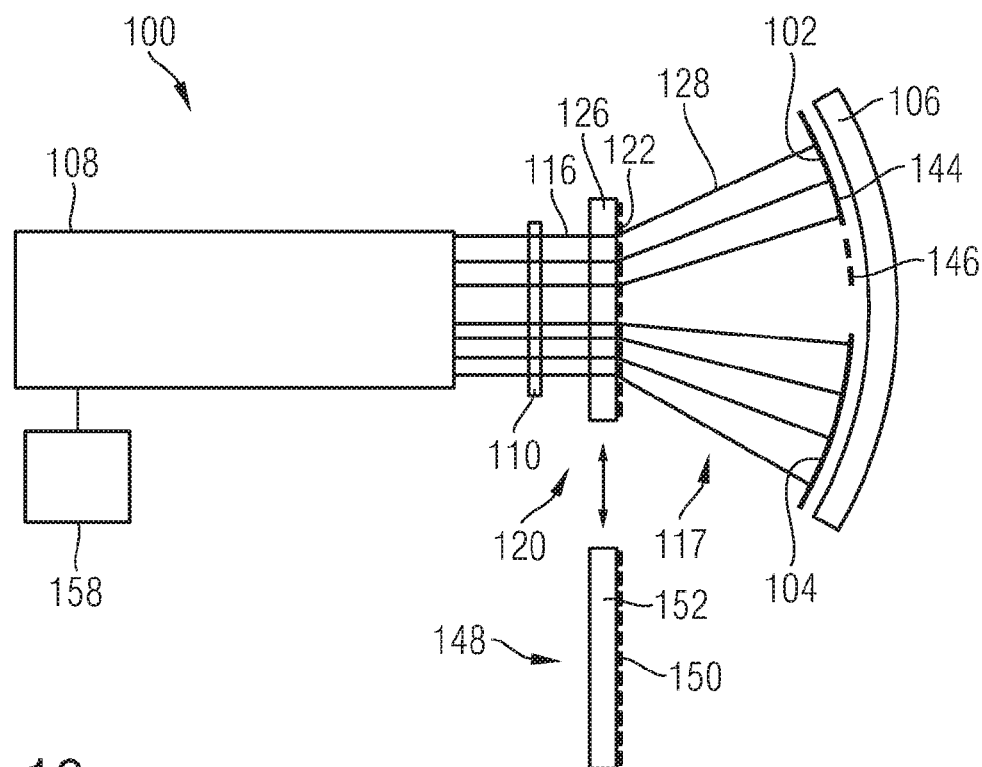
FIG. 16 shows, in a schematic illustration, a further exemplary embodiment of a measurement apparatus for measuring the shape of different portions of optical surfaces by interferometry.

FIG. 16 shows a further exemplary embodiment of the measurement apparatus 100 for simultaneously measuring the shape of optical surfaces 102 and 104 that are arranged next one another. The measurement apparatus 100 substantially corresponds to the measurement apparatus according to FIG. 14 and FIG. 15. In contrast to the latter, the first diffractive structure 122 of the CGH 126 of the wave-forming element 120 is configured in such a way that it produces, from a component of the measurement radiation 116, a measurement wave 128 that is only directed onto a first portion 144 of the first optical surface 102, said measurement wave having a wavefront that is adapted to an intended shape of the first portion 144.

For the purposes of measuring a second portion 146 of the first optical surface 102, provision is made of a further wave-forming element 148 with a correspondingly configured diffractive structure 150 in a CGH 152. For the purposes of measuring the second portion 146, the wave-forming elements 120 and 148 in the measurement apparatus 100 are interchanged after measuring the first portion 144 and the second optical surface 104 with the first wave-forming element 120. To this end, the measurement apparatus 100 can contain an interchange apparatus (not illustrated). Subsequently, the second portion 146 is measured by the second wave-forming element 148. Compiling the partial measurements to form an overall measurement of the optical surface 102 is effectuated by the evaluation device 158 using a so-called stitching method or any other suitable method.

In this way, it is also possible to measure surfaces in which the reflected measurement radiation 116 crosses at least partially on account of the shape of the surfaces. In such a case, the corresponding section of the interferogram no longer can be assigned to the respective optical surface. By way of such a measurement of portions being effectuated in succession, such running together of the reflected measurement radiation is prevented.

Accordingly, provision can also be made of measuring two portions of the second surface 104 or measuring more than two portions of the surfaces 102 and 104 in succession by further wave-forming elements. As an alternative or in addition to an interchange of wave-forming elements, the measurement apparatus may also contain a sealing device, e.g. with one or more shutters, which lets measurement radiation pass only for selectable portions of the surfaces. In such an embodiment, the wave-forming element may contain a diffractive structure for each portion. By way of example, a plurality of diffractive structures, respectively for a portion of a surface, may be provided next to one another on a CGH as a wave-forming element.

Figure 17:
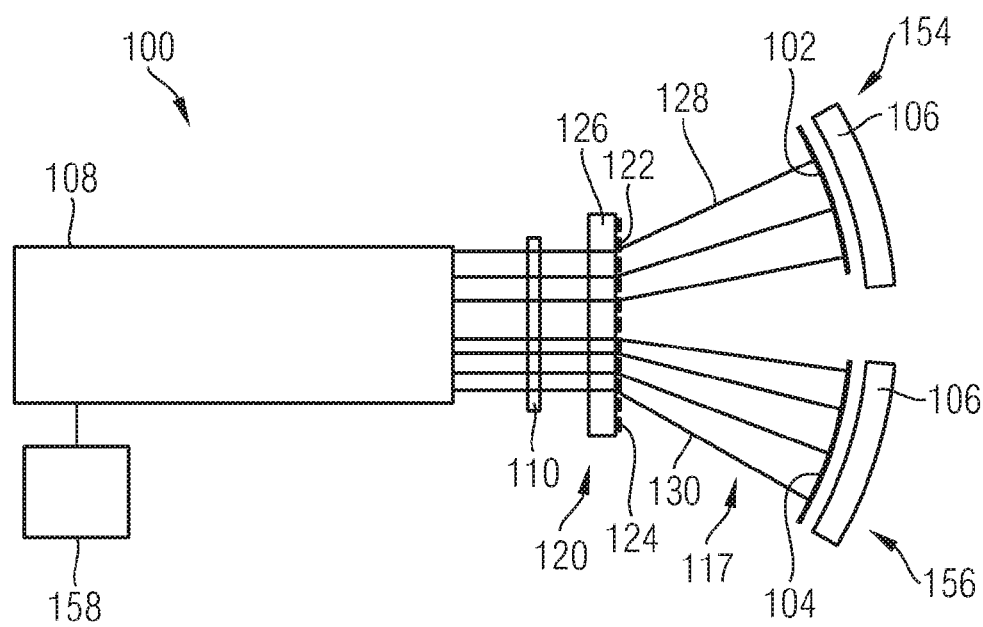
FIG. 17 shows the exemplary embodiment according to FIG. 14 in the case of the simultaneous measurement of optical surfaces of two optical elements.

FIG. 17 illustrates the exemplary embodiment of the measurement apparatus 100 according to FIG. 14 in the case of the simultaneous measurement of an optical surface 102 of a first optical element 154 and an optical surface 104 of a second optical element 156. Both optical elements 154 and 156 have a dedicated substrate 106 and they are adjustably anchored in terms of the spatial orientation to one another by an adjustment apparatus (not illustrated). Here, the optical surfaces 102 and 104 are arranged next one another in the beam path of the measurement radiation 117 comprising the measurement waves 128 and 130. Similar to the combination of a substrate with the two optical surfaces 102 and 104 according to FIG. 14, the two optical elements 154 and 156, together with the adjustment apparatus, constitute an overall module to be measured. By way of example, the optical elements 154 and 156 are two grazing incidence mirrors (G mirrors), arranged next to one another, for a projection lens or an illumination system of a projection exposure apparatus from EUV microlithography. G mirrors are mirrors which are irradiated under grazing incidence, i.e. under a flat angle of incidence. In this context, a flat angle of incidence should be understood to mean an angle of incidence which deviates from a surface normal of the irradiated mirror by at least 45°, in particular at least 60° or at least 70°. Using the measurement apparatus 100 according to FIG. 14 or any other above-described measurement apparatus, it is possible to simultaneously carry out a measurement of both surfaces 102 and 104 and of the relative positioning of the surfaces 102 and 104 in relation to one another.

The present description of exemplary embodiments is to be understood to be by way of example. The disclosure effected thereby firstly enables the person skilled in the art to understand the present invention and the advantages associated therewith, and secondly encompasses alterations and modifications of the described structures and methods that will be evident to the person skilled in the art. The applicant seeks, therefore, to cover all such alterations and modifications as fall within the spirit and scope of the invention, as defined by the accompanying claims, and equivalents thereof.

LIST OF REFERENCE SIGNS

10 Projection lens
12 Reticle
14 Wafer
16 Beam path
E1-E6 Mirrors
M1, M2, M2',M3 Optical modules
20 Wavefront measurement apparatus
22 Imaging optics 24 Measurement radiation
26 Pinhole
28 Shearing grating
30 Detector
32 Capturing plane
40 Measurement arrangement
42 Adaptation module
44 Beam path
46 CGH
48 Diffractive structure pattern
50 Imaging optical arrangement
52, 54 CGHs in reflection
56 Input-side adaptation module
58 Output-side adaptation module
60, 62 CGHs in transmission
64, 66 Complex encoded CGHs
68 Second pinhole
70 Superposed diffractive structures
72 Measurement radiation
74 Adaptation module
76 Diffractive structure pattern
78 Gap
80 Calibration unit
82 Diffractive structure pattern
84 Adaptation module
86 Diffractive structure pattern
88 Adaptation module
90 Diffractive structure pattern
92 Calibration arrangement
100 Measurement apparatus
102 First optical surface
104 Second optical surface
106 Substrate
108 Interferometer
110 Fizeau element
112 Illumination radiation
114 Reference wave
116 Test radiation
117 Measurement radiation
118 Optical axis
120 Wave-forming element
122 First diffractive structure
124 Second diffractive structure
126 CGH
128 First measurement wave
130 Second measurement wave
132 First auxiliary wave
134 First auxiliary measurement structure
136 Second auxiliary wave
138 Second auxiliary measurement structure
140 Point of the first surface
142 Point of the second surface
144 First portion
146 Second portion
148 Second wave-forming element
150 Diffractive structure
152 CGH
154 First optical element
156 Second optical element
158 Evaluation device

What is claimed is:

1. An apparatus, comprising:
a partial optical arrangement of a microlithographic exposure apparatus, wherein the partial optical arrangement comprises at least two optical elements; and
a measurement arrangement for measuring the partial optical arrangement of the microlithographic exposure apparatus, comprising:
a wavefront measurement apparatus configured to measure a wavefront aberration of the partial optical arrangement with measurement radiation, and
at least one adaptation module comprising one or more diffractive structure patterns that are operated in reflection or in transmission,
wherein the adaptation module is configured for manipulation of the wavefront of the measurement radiation such that the partial optical arrangement being measured and the at least one adaptation module in combination form an imaging optical arrangement.

2. The apparatus as claimed in claim 1, wherein:
the partial optical arrangement is assigned to an imaging optical system, comprising a plurality of optical elements, of a microlithographic projection exposure apparatus and
the partial optical arrangement is formed by:
one of the optical elements of the imaging optical system, or
a partial arrangement of the optical elements of the imaging optical system.

3. The apparatus as claimed in claim 2,
wherein the partial optical arrangement is formed by a partial arrangement of the optical elements of the imaging optical system, wherein the partial optical arrangement differs from at least one section of the imaging optical system by presence of a gap that relates to at least one optical element.

4. The apparatus claimed in claim 1,
wherein the adaptation module is configured to shorten a back focal length of the partial optical arrangement being measured.

5. The apparatus as claimed in claim 1,
further comprising a calibration unit having an optical function of the partial optical arrangement being measured,
wherein the calibration unit is configured to calibrate the at least one adaptation module before measuring the partial optical arrangement, and
wherein the calibration is carried out by determining a wavefront aberration of an arrangement comprising the at least one adaptation module and the calibration unit.

6. The apparatus as claimed in claim 1,
wherein the at least one adaptation module comprises:
an input-side adaptation module configured to manipulate the measurement radiation, and arranged in a beam path of the measurement radiation upstream of the partial optical arrangement being measured, and
an output-side adaptation module configured to manipulate the measurement radiation, and arranged in the beam path of the measurement radiation downstream of the partial optical arrangement being measured.

7. The apparatus as claimed in claim 1,
wherein the at least one adaptation module contains at least two diffractive structure patterns that are superposed on one another, or are arranged in succession, in a beam path of the measurement radiation.

8. A method for measuring a wavefront aberration of an imaging optical system of a microlithographic projection exposure apparatus, comprising a plurality of optical elements configured to image a pattern from an object plane into an image plane, comprising:

arranging a measurement arrangement for measuring different partial optical arrangements of the optical elements in an optical path of measurement radiation, wherein each of the different partial optical arrangement comprises at least two optical elements;

measuring a first wavefront aberration of a first partial optical arrangement of the optical elements; and measuring, separately from the measurement of the wavefront aberration of the first partial optical arrangement of the optical elements, a second wavefront aberration of a second partial optical arrangement of the optical elements.

9. The method as claimed in claim 8, wherein at least one of the first partial optical arrangement or the second partial optical arrangement differs from at least one section of the imaging optical system as it includes at least one fewer optical element than the imaging optical system.

10. The method as claimed in claim 8, further comprising: providing the imaging optical system with a plurality of optical modules that respectively comprise at least two of the optical elements, and effectuating the separate measurement of the respective wavefront aberrations of the first partial optical arrangement and the second partial optical arrangement through separate measurement of respective wavefront aberrations of individual ones of the optical modules.

11. The method as claimed in claim 8, wherein the measuring of the first partial optical arrangement or the second partial optical arrangement comprises:

arranging a partial optical arrangement being measured and at least one adaptation module in a beam path of the measurement radiation of a wavefront measurement apparatus such that the partial optical arrangement being measured and the at least one adaptation module in combination form an imaging optical arrangement, and determining the wavefront aberration of the imaging optical arrangement with the wavefront measurement apparatus.

12. The method as claimed in claim 11, wherein the arranging of the at least one adaptation module comprises arranging an input-side adaptation module to manipulate the measurement radiation upstream of the partial arrangement being measured, and arranging an output-side adaptation module to manipulate the measurement radiation downstream of the partial arrangement being measured.

13. The method as claimed in claim 11, further comprising:

using at least one diffractive structure pattern to manipulate the wavefront of the measurement radiation in the at least one adaptation module.

14. The method as claimed in claim 13, wherein the diffractive structure pattern is operated in reflection to manipulate the wavefront of the measurement radiation.

15. The method as claimed in claim 13, wherein, at least two diffractive structure patterns that are arranged successively in the beam path of the measurement radiation are used to manipulate the measurement radiation in the at least one adaptation module.

16. The method as claimed in claim 13, wherein, at least two diffractive structure patterns that are arranged superposed on one another in the beam path are used to manipulate the measurement radiation in the at least one adaptation module.

17. A measurement arrangement for measuring a partial optical arrangement comprising at least two optical elements of a microlithographic projection exposure apparatus, comprising:

a wavefront measurement apparatus configured to measure a wavefront aberration of imaging optics with measurement radiation, and at least one adaptation module
which has one or more diffractive structure patterns that are operated in reflection or in transmission, and
which is configured for manipulation of the wavefront of the measurement radiation such that the partial optical arrangement being measured and the at least one adaptation module in combination form an imaging optical arrangement, wherein the manipulation of the wavefront of the measurement radiation comprises manipulating an output of the partial optical arrangement that deviates by at least $\lambda$ from an ideal spherical wave to a wavefront that does not deviate by more than $\lambda$ at any point from an ideal spherical wave.

18. The measurement arrangement of claim 17, wherein the output of the partial optical arrangement deviates by at least $10\lambda$ from an ideal spherical wave.

* * * * *

UNITED STATES PATENT AND TRADEMARK OFFICE
CERTIFICATE OF CORRECTION

PATENT NO. : 10,502,545 B2
APPLICATION NO. : 15/818080
DATED : December 10, 2019
INVENTOR(S) : Ulrich Wegmann et al.

Page 1 of 1

It is certified that error appears in the above-identified patent and that said Letters Patent is hereby corrected as shown below:

In the Claims

Column 26, Line 34, In Claim 4, after "apparatus" insert -- as --.

Signed and Sealed this
First Day of September, 2020

Andrei Iancu
*Director of the United States Patent and Trademark Office*